United States Patent
Koh et al.

(10) Patent No.: US 8,451,656 B2
(45) Date of Patent: May 28, 2013

(54) MULTI-LEVEL MEMORY DEVICES AND METHODS OF OPERATING THE SAME

(75) Inventors: Gwan-Hyeob Koh, Seoul (KR); Dae-Won Ha, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/487,463

(22) Filed: Jun. 4, 2012

(65) Prior Publication Data

US 2012/0236627 A1  Sep. 20, 2012

Related U.S. Application Data

(63) Continuation of application No. 12/283,175, filed on Sep. 10, 2008, now Pat. No. 8,213,223.

(30) Foreign Application Priority Data

Sep. 11, 2007  (KR) .................. 10-2007-0092219

(51) Int. Cl.
*G11C 11/00*  (2006.01)

(52) U.S. Cl.
USPC .......................................... 365/163; 365/148

(58) Field of Classification Search
USPC .......... 365/46, 94, 100, 113, 129, 148, 163; 257/2–5, 9, 296, 310, E21.35, E31.047, E27.006; 438/29, 95, 96, 166, 135, 240, 785, 438/259, 365, 482, 486, 597; 977/754
See application file for complete search history.

(56) References Cited

U.S. PATENT DOCUMENTS

| | | | |
|---|---|---|---|
| 6,141,241 A | 10/2000 | Ovshinsky et al. | |
| 6,809,362 B2 | 10/2004 | Gilton | |
| 6,908,808 B2 | 6/2005 | Gilton | |
| 7,202,520 B2 * | 4/2007 | Gilton | 257/307 |
| 7,227,221 B2 | 6/2007 | Ovshinsky | |
| 7,233,017 B2 | 6/2007 | Yoon et al. | |
| 7,375,365 B2 * | 5/2008 | Hsiung | 257/2 |
| 7,859,893 B2 * | 12/2010 | Liu et al. | 365/163 |
| 7,910,904 B2 * | 3/2011 | Kuo et al. | 257/2 |
| 2003/0156452 A1 | 8/2003 | Gilton | |
| 2004/0223357 A1 | 11/2004 | Gilton | |
| 2006/0077706 A1 * | 4/2006 | Li et al. | 365/163 |

(Continued)

FOREIGN PATENT DOCUMENTS

| | | |
|---|---|---|
| KR | 10-2004-0079451 | 9/2004 |
| KR | 10-2004-0083457 | 10/2004 |
| KR | 10-2006-0039996 | 10/2006 |
| KR | 10-2006-0121895 | 11/2006 |

OTHER PUBLICATIONS

Lelmini, Daniele, et al., "Recovery and Drift Dynamics of Resistance and Threshold Voltages in Phase-Change Memories", IEEE Transactions on Electron Devices, vol. 54, No. 2, Feb. 2007, pp. 308-315.

(Continued)

*Primary Examiner* — Harry W Byrne
(74) *Attorney, Agent, or Firm* — Muir Patent Consulting, PLLC

(57) ABSTRACT

The present invention provides a multi-level memory device and method of operating the same. The device comprises a memory structure in which a distribution density of resistance levels around its minimum value is higher than that around its maximum value.

18 Claims, 25 Drawing Sheets

U.S. PATENT DOCUMENTS

| | | |
|---|---|---|
| 2006/0091374 A1 | 5/2006 | Yoon et al. |
| 2006/0097239 A1* | 5/2006 | Hsiung .............................. 257/4 |
| 2006/0118774 A1 | 6/2006 | Ovshinsky |
| 2006/0257787 A1* | 11/2006 | Kuo et al. ................ 430/270.13 |
| 2007/0128792 A1* | 6/2007 | Gilton ........................... 438/239 |
| 2007/0274120 A1* | 11/2007 | Pinnow et al. ................ 365/148 |
| 2008/0185575 A1* | 8/2008 | Hsiung .............................. 257/4 |
| 2008/0298114 A1* | 12/2008 | Liu et al. ........................ 365/148 |
| 2009/0067230 A1 | 3/2009 | Koh et al. |
| 2009/0244962 A1* | 10/2009 | Gordon et al. ................ 365/163 |

OTHER PUBLICATIONS

"Multi-Level Memory Devices and Methods of Operating the Same" Specification, Drawings, Claims and Prosecution History, of U.S. Appl. No. 12/283,175, filed Sep. 10, 2008, by Gwan-Hyeob Koh, et al.

\* cited by examiner

MULTI-LEVEL MEMORY DEVICES AND METHODS OF OPERATING THE SAME

RELATED APPLICATION/PRIORITY STATEMENT

This application is a continuation application of U.S. patent application Ser. No. 12/283,175, filed on Sep. 10, 2008, which claims priority under 35 U.S.C §119 to Korean Patent Application No. 10-2007-0092219, filed on Sep. 11, 2007, in the Korean Intellectual Property Office, the entire contents of which are incorporated by reference.

BACKGROUND

1. Technical Field

The present invention is related to a memory semiconductor device, more particularly, to a multi-level memory device and method of operating the same.

2. Description of Related Art

A phase-change layer has a property of variable electrical resistance depending on its crystalline state, and it may be used to store data in a multi-level memory device. The electrical resistance of the phase-change layer is low in a crystalline state (i.e. a set-state), and high in an amorphous state (i.e. a reset-state). Therefore, the crystalline state of the phase-change layer corresponding to the stored data may be verified by measuring the electrical resistance of the phase-change layer.

The crystalline state of the phase-change layer may be controlled by time and temperature. FIG. 1 is a graph illustrating variation of crystalline state of the phase-change layer according to time and temperature. In the graph, the x-axis indicates time (T), and the y-axis indicates temperature (TMP).

Referring to FIG. 1, when the phase-change layer is heated at a temperature higher than the melting temperature (Tm) for a first duration (T1), then cooled, the phase-change layer becomes an amorphous state ①. Also, when the phase-change layer is heated at a temperature lower than the melting temperature (Tm) and higher than the crystallization temperature (Tc) for a second duration (T2), then cooled, the phase-change layer becomes a crystalline state ②. Here, the second duration (T2) is a longer term than the first duration T1.

Recently, in order to meet the increased demand in memory capacity in memory semiconductor devices, a multi-level cell, which stores a plurality of data in a single memory cell, has been introduced. In order to realize such a multi-level cell in a multi-level memory device, a method of controlling volume of the crystallized area in the phase-change layer is introduced. As described above, as each phase-change layer has different resistance according to its crystalline state, the total resistance level of the phase-change memory cell of this method is determined by the volume rate of the amorphous or crystalline region of the phase-change layer. Therefore, in order to realize the multi-level cell, discrete control of the volume of the region where the crystalline state changes is required. However, as the crystallization of the phase-change layer depends on the temperature, which is a parameter that is difficult to control spatially, the discrete control of the volume of the phase-changeable region is difficult to achieve.

Furthermore, as the resistance level of the phase-change memory cell according to this method is dominantly determined by the resistance level of the amorphous region, there is another problem that it is difficult to realize the multi-level cell. In detail, FIG. 2 illustrates the relation between the volume of the phase-changeable region and the resistance level of the phase-change memory cell. For clarity of description, the phase-change layer will be assumed to include three different phase-changeable regions P1, P2, and P3.

Referring to FIG. 2, since the phase-changeable regions P1, P2, and P3 are connected in series, the total resistance level (R) of the phase-change layer is equal to a sum of R1, R2, and R3, which denote the resistance of the phase-changeable regions P1, P2, and P3, respectively, as, follows:

$$R = R1 + R2 + R3. \qquad \text{[Equation 1]}$$

To show an example of a numerical analysis, the resistance of each phase-changeable region will be assumed to be 1 kΩ in a set-state (i.e. crystalline state), and 100 kΩ in a reset state (i.e. amorphous state).

TABLE 1

| | State (Resistance) | | | |
|---|---|---|---|---|
| R1 | Set(1 kΩ) | Reset(100 kΩ) | Reset(100 kΩ) | Reset(100 kΩ) |
| R2 | Set(1 kΩ) | Set(1 kΩ) | Reset(100 kΩ) | Reset(100 kΩ) |
| R3 | Set(1 kΩ) | Set(1 kΩ) | Set(1 kΩ) | Reset(100 kΩ) |
| R | 3 kΩ(~0 kΩ) | 102 kΩ (~100 kΩ) | 201 kΩ(~200 kΩ) | 300 kΩ |
| Data | 00 | 01 | 10 | 11 |

As shown in the above Table 1, the resistance level R of the total phase-change layer may have four different data states (00, 01, 10, 11) according to the crystalline states of the respective phase-changeable regions P1, P2, and P3, and the data state depends on the number of phase-changeable regions in the reset state.

However, according recent research, as shown in FIG. 3, the resistance level in the reset state varies over time (D. Ielmini et. al., IEEE Transactions on Electron Device, 2007, vol. 54, 308-315). As shown in FIG. 4, the drifts of such resistance lead to a change of the resistance level of the phase-change memory cells, and moreover, the resistance level window, required in order to distinguish the data states, may disappear. Particularly, in a structure where the phase-changeable regions are connected in series, since the time-depending drift of resistance is also given by the Equation 1, the change in the resistance of the data states increase in proportion to the number of the phase-changeable regions, which are in the reset state.

SUMMARY

Exemplary embodiments of the present invention are related to a multi-level memory device and method of operating the same.

According to a first aspect, the invention is directed to a multi-level memory device which includes a memory structure interposed between a first electrode and a second electrode, wherein a distribution density of the resistance level of the memory structure is higher around its minimum value than around its maximum value.

In one embodiment, all of the resistance levels of the memory structure except the maximum value are closer to its minimum value than its maximum value.

In one embodiment, all of the resistance levels of the memory structure except the maximum value are smaller than a predetermined middle resistance level, and the middle resistance level is a value in the range between $(R_{max} - R_{min})/30$ and $R_{max}$ (where $R_{max}$=the maximum value of resistance level of memory structure, $R_{min}$=the minimum value of resistance level of memory structure).

In one embodiment, the memory structure includes a plurality of variable resistive patterns, and the resistance levels of the memory structure are substantially determined by a number of the variable resistive patterns in a low resistance level state.

In one embodiment, the resistance levels of the memory structure are substantially inversely proportional to the number of variable resistive pattern in a low resistance level state.

In one embodiment, the variable resistive patterns are connected in parallel between the first and the second electrodes.

In one embodiment, the resistance level R of the memory structure is given by the following equation:

$$\frac{1}{R} = \sum_{i=1}^{n} \frac{1}{R_i}$$

($R_i$ is a resistance of the variable resistive pattern, n is the number of variable resistive patterns in the memory structure).

In one embodiment, the variable resistive pattern includes a material having temperature-dependent resistance level characteristics.

In one embodiment, respective variable resistive patterns are configured to be capable of changing resistance level by different write operation conditions.

In one embodiment, the variable resistive patterns comprise a chalcogen compound selected from a group including at least one of antimony (Sb), tellurium (Te), and selenium (Se), and the antimony-tellurium-selenium component ratio of each variable resistive pattern are different from each other.

In one embodiment, the multi-level memory device further comprises: a word line disposed below the first electrode; a diode between the word line and the first electrode; and a bit line connected to the second electrode to cross the word line.

In one embodiment, the multi-level memory device further comprises: a selection transistor disposed below the first electrode, including a gate electrode, a source electrode and a drain electrode; a plug connecting the drain electrode of the selection transistor and the first electrode; and a bit line connected to the second electrode. The gate electrode of the selection transistor is coupled with the word line crossing the bit line.

According to another aspect, the present invention is directed to a multi-level memory device which includes a plurality of variable resistive patterns, wherein the variable resistive patterns are configured such that a total resistance level of the variable resistive patterns is substantially determined by the number of variable resistive patterns that are in a low resistance level state.

In one embodiment, the multi-level memory device further comprises a first electrode and a second electrode disposed around the variable resistive patterns, wherein the variable resistive patterns are connected in parallel between the first and the second electrodes.

In one embodiment, the total resistance level of the variable resistive patterns is substantially inversely proportionate to the number of variable resistive patterns in a low variable resistance state.

According to another aspect, the present invention is directed to a multi-level memory device comprising a memory pattern between a first electrode and a second electrode, wherein the memory pattern comprises a plurality of phase-change patterns having different crystallization temperatures and connecting the first and the second electrodes in parallel.

In one embodiment, the phase-change patterns are made of different materials.

In one embodiment, the phase-change patterns comprise a material selected from a group of chalcogen compounds including at least one of antimony (Sb), tellurium (Te), and selenium (Se).

In one embodiment, the phase-change patterns are different from each other, in antimony-tellurium-selenium component ratio.

In one embodiment, the phase-change patterns are different from each other in area contacting the first electrode or the second electrode.

In one embodiment, the phase-change patterns are different from each other in thickness or cross-sectional area.

In one embodiment, the multi-level memory device further comprises a substrate disposed under the first electrode, wherein the phase-change patterns are different from each other in a distance from a top surface of the substrate.

In one embodiment, at least one of the phase-change patterns is configured to be in contact with sidewalls of the first and second electrodes.

In one embodiment, the first and second electrodes are formed on different levels, and the phase-change patterns are configured to connect a top surface of the first electrode and a bottom surface of the second electrode, in parallel.

In one embodiment, the multi-level memory device further comprises: a word line below the first electrode; a diode disposed between the word line and the first electrode; and a bit line connected to the second electrode to cross the word line.

In one embodiment, the multi-level memory device further comprises: a selection transistor below the first electrode, the selection transistor including a gate electrode, a source electrode, and a drain electrode; a plug configured to connect the drain electrode of the selection transistor and the first electrode; and a bit line connected to the second electrode. The gate electrode of the selection transistor is connected to the word line crossing the bit line.

According to another aspect, the present invention is directed to a method of operating a multi-level memory device comprising a write step for changing a resistance level of a memory structure, wherein a distribution density of resistance levels of the memory structure modified by the write step is higher around its minimum value than around its maximum value.

In one embodiment, the write step comprises changing all of the resistance levels of the memory structure except the maximum value into a resistance level that is closer to its minimum value than its maximum value.

In one embodiment, the write step comprises changing the resistance level of the memory structure into an intended resistance level, through a one-step operation.

In one embodiment, all of the resistance levels of the memory structure except the maximum value are smaller than a predetermined middle resistance level, and the middle resistance level is a value in the range between $(R_{max}-R_{min})/30$ and $R_{max}$ ($R_{max}$=maximum value of resistance level of memory structure, $R_{min}$=minimum value of resistance level of memory structure).

In one embodiment, the memory structure comprises a plurality of variable resistive patterns, and the resistance level of the memory structure is substantially inversely proportionate to the number of variable resistive patterns in a low resistance level state.

In one embodiment, the operation condition required for changing the resistance level of the variable resistive pattern is different in each of the variable resistive patterns.

In one embodiment, the write step comprises using the operation conditions, which are different in each of the variable resistance patterns, to change selectively the resistance levels of the variable resistance patterns.

According to another aspect the present invention is directed to a method of operating a multi-level memory device comprising changing selectively crystalline states of variable resistive patterns, which are connected in parallel between two electrodes, by using different crystallization temperatures between the variable resistive patterns.

In one embodiment, the method of operating comprises a step of crystallizing all of the variable resistive patterns. The step of crystallizing comprises: heating all of the variable resistive patterns to a temperature over their melting points; and cooling all of the heated variable resistive patterns, under a condition of temperature that is over respective crystallization temperatures of the variable resistive patterns and a condition of time that is longer than the respective crystallization time periods of the variable resistive patterns.

In one embodiment, the method of operating comprises a step of amorpholizing all of the variable resistive patterns. The step of amorpholizing comprises: heating all of the variable resistive patterns to a temperature over their melting points; and cooling all of the heated variable resistive patterns, under a condition of temperature that is under respective crystallization temperatures of the variable resistive patterns and a condition of time that is shorter than the respective crystallization time periods of the variable resistive patterns.

In one embodiment, the method of operating the multi-level memory device comprises a step of crystallizing selectively at least one of the variable resistive patterns whose crystallization temperature is lower than that of a selected variable resistive pattern. The selective crystallizing step comprises: heating all of the variable resistive patterns to a temperature over their melting points; cooling the heated variable resistive patterns to a temperature that is over a crystallization temperature of the selected variable resistive pattern; and maintaining a condition of temperature that is over the crystallization temperature of the selected variable resistive pattern and a condition of time that is longer than a crystallization time period of selected variable resistive pattern.

In one embodiment, cooling the heated variable resistive patterns to a temperature that is over a crystallization temperature of the selected variable resistive pattern comprises cooling the heated variable resistive patterns to a temperature that is lower than the crystallization temperature of an unselected variable resistive pattern whose crystallization temperature is higher than the crystallization temperature of the selected variable resistive pattern, in a time period that is shorter than a crystallization time period of an unselected variable resistive pattern whose crystallization temperature is higher than the crystallization temperature of the selected variable resistive pattern.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 9A to 12A are plan views for illustrating a method of fabricating a multi-level memory device according to an exemplary embodiment of the present invention.

FIGS. 9B to 12B are cross-sectional views for illustrating a method of fabricating a multi-level memory device according to an exemplary embodiment of the present invention.

FIGS. 13A to 17A are plan views for illustrating a method of fabricating a multi-level memory device according to another exemplary embodiment of the present invention.

FIGS. 13B to 17B are cross-sectional views for illustrating a method of fabricating a multi-level memory device according to another exemplary embodiment of the present invention.

DETAILED DESCRIPTION OF PREFERRED EMBODIMENTS

Figure 1:
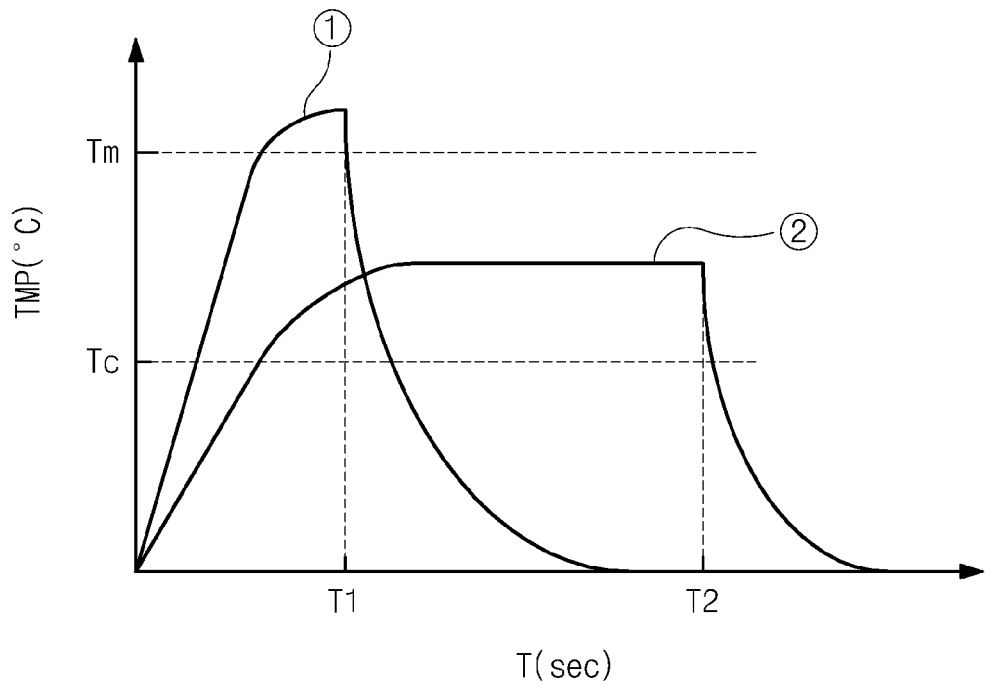
FIG. 1 is a graph illustrating varied characteristics of crystalline state of a phase-change layer according to temperature and time period.
Figure 2:
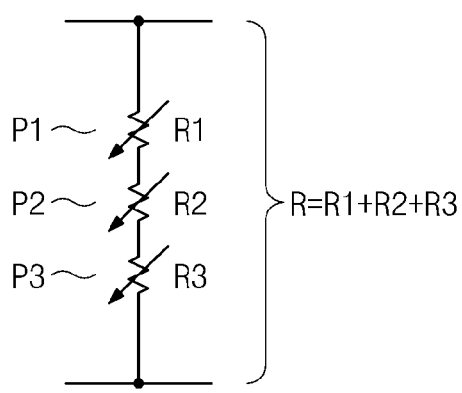
FIG. 2 illustrates the relation between the volume of a phase-changeable region and the resistance level of a phase-change memory cell.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 5:
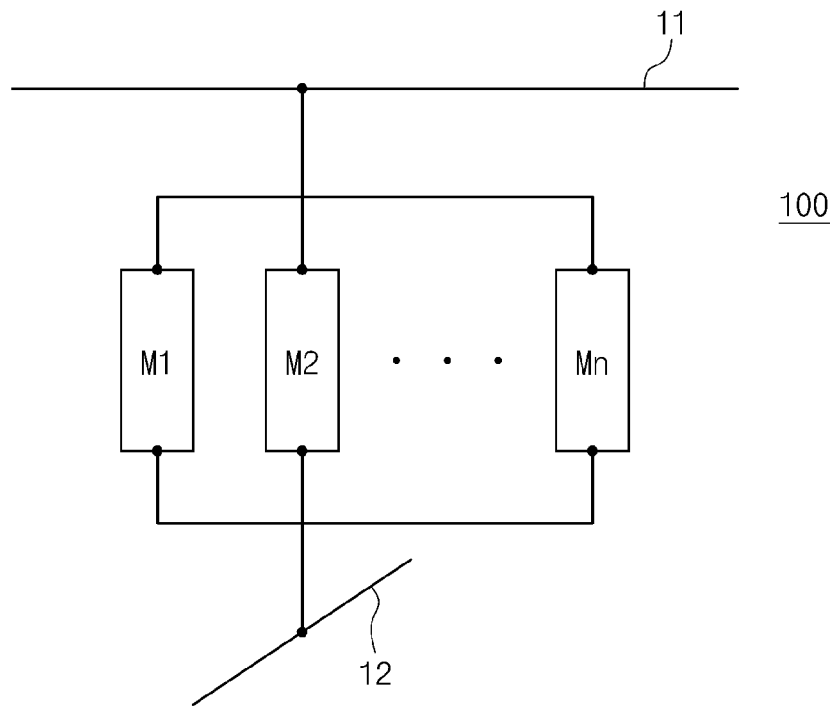
FIG. 5 is a circuit diagram for illustrating a unit cell of a multi-level memory cell according to the present invention.

FIG. 5 is a circuit diagram illustrating a unit cell of a multi-level memory device according to an embodiment of the present invention.

Referring to FIG. 5, the unit cell 100 of the multi-level memory device according the present invention includes a first electrode 11, a second electrode 12, and a plurality of memory elements M1-Mn interposed between the first and the second electrodes 11 and 12, which construct a memory structure. The respective memory elements M1-Mn may include variable resistive pattern which is capable of varying its crystalline state by means of changing temperature condition. Here, the variable resistive patterns of each of the memory elements M1-Mn may be made of a material selected from a group of chalcogen compounds including antimony (Sb), tellurium (Te), and selenium (Se).

The multi-level memory device including the chalcogen compound is at least one of the technical fields where the technical idea of the present invention may be applied. However, the technical idea of the present invention is not limited to such technical field, but can be applied to other various memory devices for multi-level cells.

According to the present invention, the memory elements M1-Mn are configured so that the first and the second electrodes 11 and 12 are connected in parallel. In this case, the resistance level R of the memory structure may be given by $$\frac{1}{R} = \sum_{i=1}^{n} \frac{1}{R_i}, \qquad \text{[Equation 2]}$$

where Ri denotes a resistance of the memory element Mi. For example, suppose that the unit cell has three memory elements M1, M2, and M3, and resistance of each of the memory elements is 1 kΩ in a set-state (i.e. crystalline state) and 100 kΩ in a reset state (i.e. amorphous state). In this case, the total resistance level R of the memory elements can be given by

TABLE 2

| | State (Resistance) | | | |
|---|---|---|---|---|
| R1 | Set(1 kΩ) | Reset(100 kΩ) | Reset(100 kΩ) | Reset(100 kΩ) |
| R2 | Set(1 kΩ) | Set(1 kΩ) | Reset(100 kΩ) | Reset(100 kΩ) |
| R3 | Set(1 kΩ) | Set(1 kΩ) | Set(1 kΩ) | Reset(100 kΩ) |
| R | ~0.33 kΩ | ~0.50 kΩ | ~0.98 kΩ | ~33.33 kΩ |
| Ratio | $R_{00}$ | 1.49 $R_{00}$ | 2.94 $R_{00}$ | 100 $R_{00}$ |
| Data | 00 | 01 | 10 | 11 |

As can be seen from Table 2, in case the memory elements M1-Mn are connected in parallel, the resistance level R of the memory structure is dominantly determined by the number of memory elements, which are in set state. That is, the total resistance level of the memory elements is substantially determined by the number of memory elements in low resistance level states (i.e. set states). The resistance level of the memory structure is substantially inversely proportionate to the number of memory elements in low resistance level states (i.e. set states).

According to another aspect of the present invention, the resistance level of the memory structure, except for its maximum value 33.33 kΩ, may be said to be around its minimum value $R_{00}$. Specifically, in Table 2, resistance levels 0.33 kΩ, 0.50 kΩ, 0.98 kΩ in data state of 00, 01, and 10 have smaller differences from the minimum value (i.e. resistance level 0.33 kΩ in data state of 00) than differences from the maximum value (i.e. resistance level 33.33 kΩ in data state of 11). Here, it is clear from the arithmetic relation shown by example in Table 2, that the resistance characteristic on difference between the maximum values and minimum values are independent of a number of memory elements. Also, as seen from Table 2, the resistance level of memory structure except for the maximum value 33.33 kΩ is always smaller than a predetermined middle resistance level. According to Table 2, the middle resistance level may be approximately 1 kΩ. However, according to modified embodiments of the present invention, this middle resistance level may be a level between ($R_{max}$-$R_{min}$)/30 and the maximum value (e.g. 33.33 kΩ). (Here, $R_{max}$ and $R_{min}$ are the maximum and minimum values of resistance level of the memory structure, respectively.)

Figure 3:
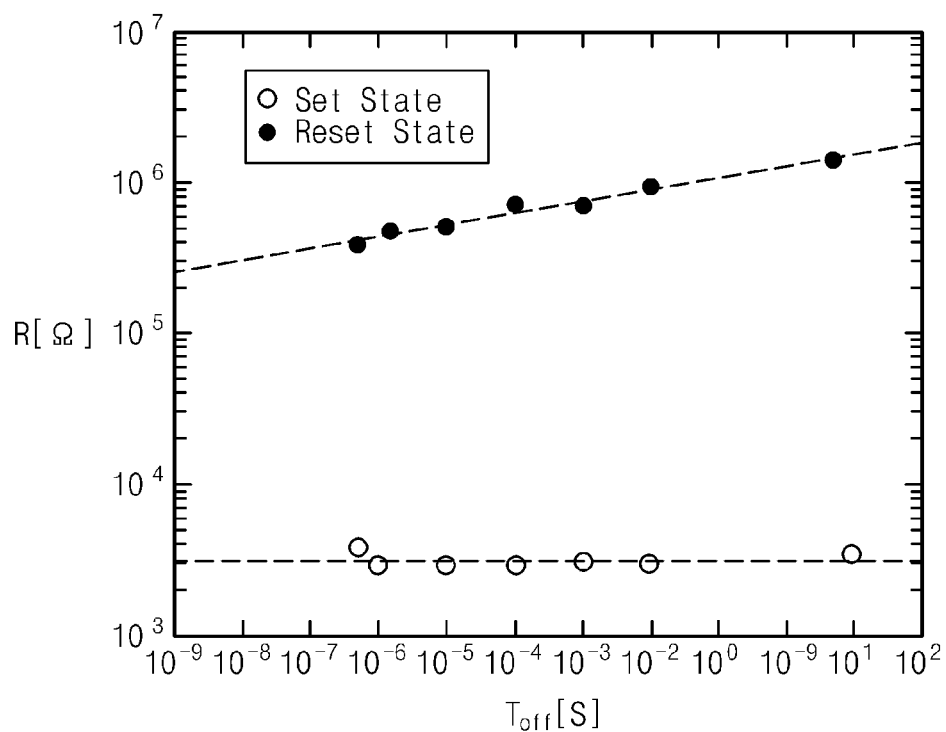
FIG. 3 is a graph for illustrating a time-dependent drift effect of the resistance level.
Figure 4:
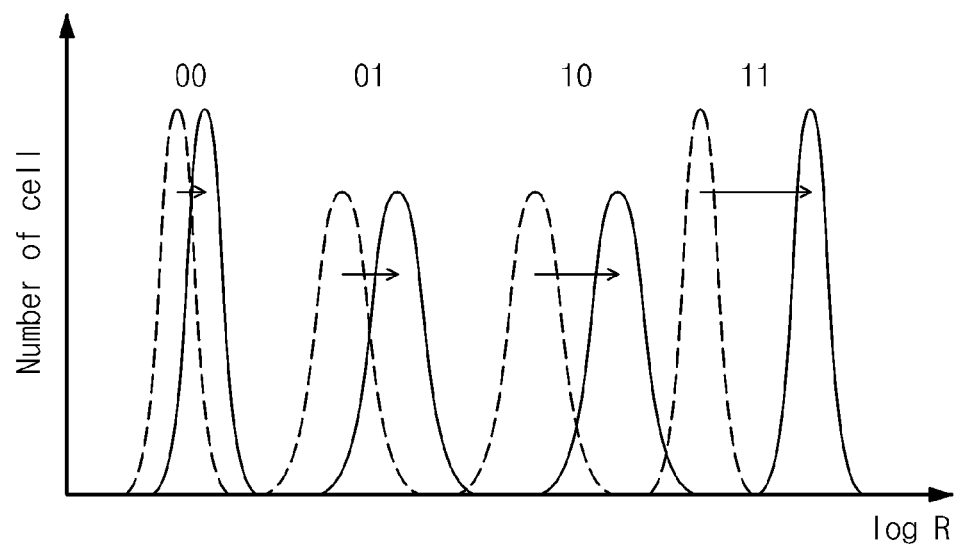
FIG. 4 is a graph for illustrating a variation of the resistance levels of phase-change memory cells caused by a resistance drift.

In this respect, the conventional problems described referring to FIG. 3, such as a time-dependent drift in reset resistance and a narrowing of resistance level window, can be overcome in the multi-level memory device including the memory elements of the present invention, which are connected in parallel.

Figure 6:
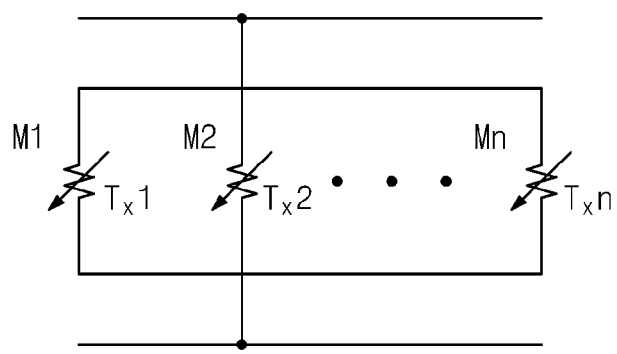
FIG. 6 is a circuit diagram for illustrating a unit cell of a multi-level memory cell according an exemplary embodiment of the present invention.

For the case that the memory elements M1-Mn are connected between the first and the second electrodes 11 and 12, a method capable of varying selectively the crystalline states of the variable resistive pattern is needed to identify the data states of the unit cell. FIG. 6 is a circuit diagram illustrating an embodiment of the present invention capable of realizing this.

Referring to FIG. 6, the variable resistive patterns of the respective memory elements M1-Mn may be made of materials having each different crystallizing temperatures Tx1, Tx2, . . . , Txn. For example, the memory elements M1-Mn may each include a different kind of phase-change material. Specifically, the variable resistive patterns of the respective memory elements M1-Mn may be made of the above described chalcogen compounds, which have different component ratio of antimony-tellurium-selenium.

FIGS. 7A to 7D are timing diagrams for illustrating an operation method of a multi-level memory device according to the present invention. For this exemplary description, it is assumed that the unit cell 100 has three memory elements M1, M2, and M3 and the crystallizing temperatures of the variable resistive patterns of the respective memory elements are Tx1, T2(<Tx1), and Tx3(<Tx2). FIGS. 7A to 7D are timing diagrams for realizing data states of (11, 10, 01, 00) in Table 2, respectively.

Figure 7A:
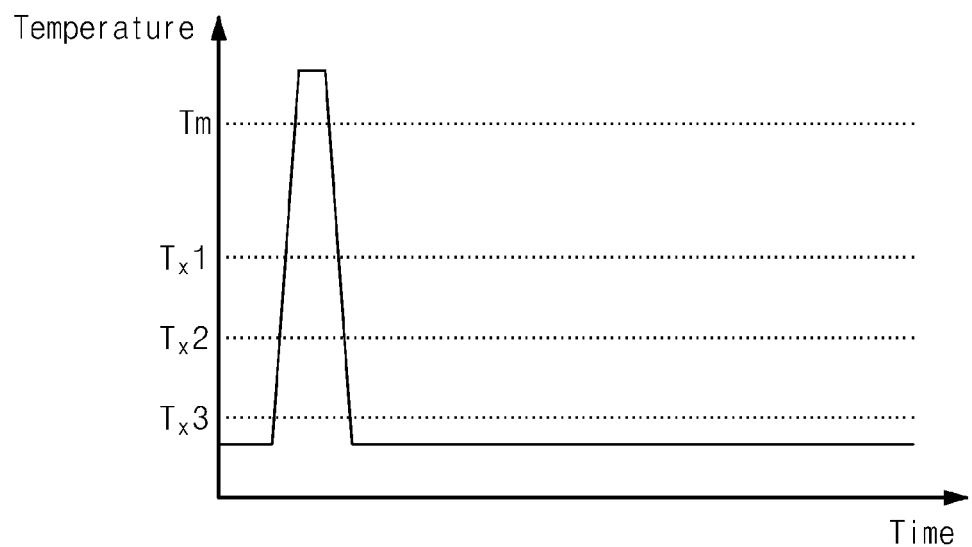
FIGS. 7A to 7D are timing diagrams for illustrating a method of operating a multi-level memory cell according to the present invention.

Referring to FIG. 7A, all of the variable resistive patterns are heated to a temperature above their melting point, then rapidly quenched. The quenching step includes quenching the variable resistive patterns to a temperature below the Tx3, in a period shorter than the minimum value of the crystallization time of the variable resistive patterns (Here, the crystallization time is the duration of temperature condition above the crystallization temperature, which is required for crystallizing the corresponding variable resistive pattern). In this case, all of the variable resistive patterns become amorphous states, and their memory cells become data state of (11).

Figure 7B:
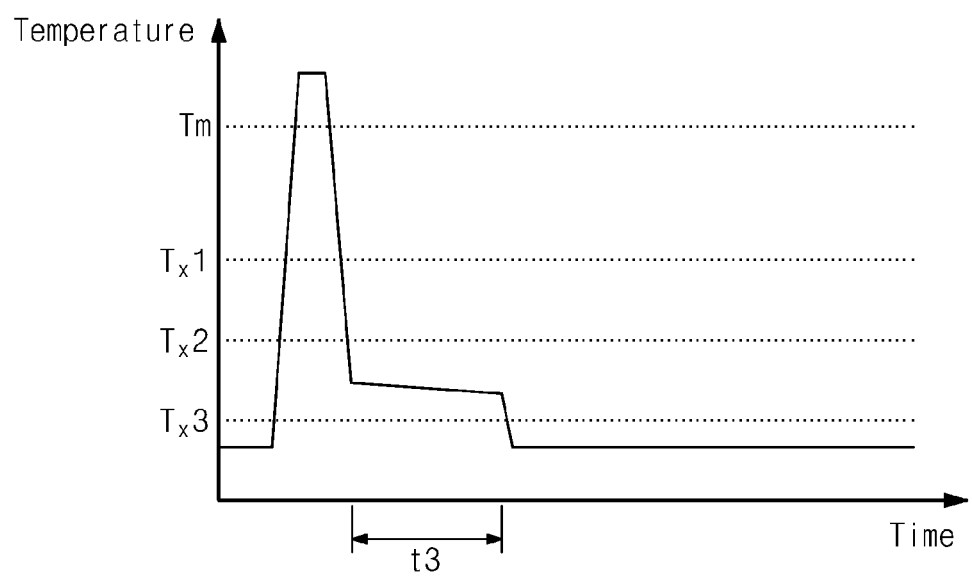

Referring to FIG. 7B, all of the variable resistive patterns are heated to a temperature above the melting point, and then rapidly quenched to a temperature between Tx3 and Tx2. After that, a temperature condition above Tx3 is maintained over a period of time longer than the crystallization time required for crystallizing the memory element M3. In this case, the memory elements M1 and M2 become amorphous states, and the memory element M3 become a crystalline state. The memory cell which passes through such thermal processes, become a data state of (10).

Figure 7C:
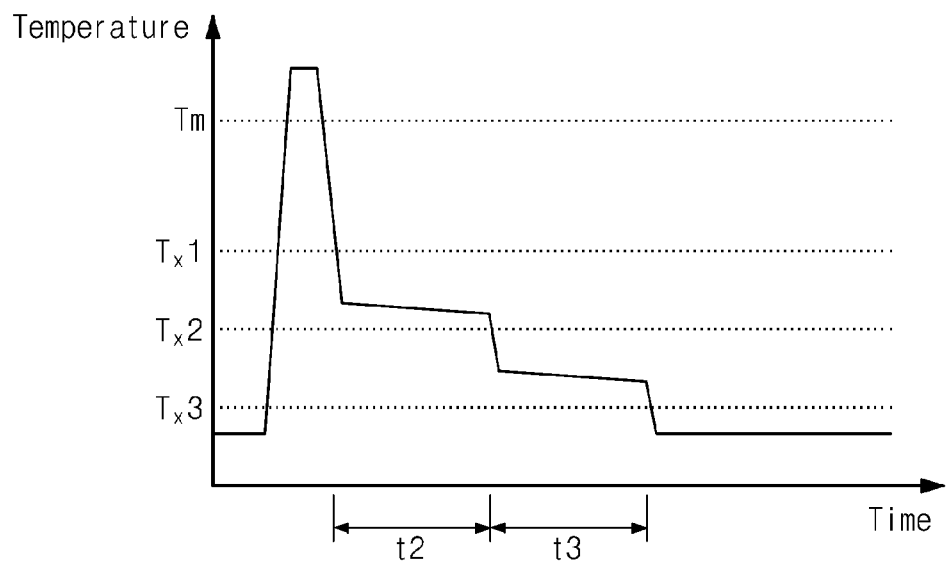

Referring to FIG. 7C, all of the variable resistive patterns are heated to a temperature above the melting point, and then rapidly quenched to a temperature between Tx2 and Tx1. In this case, the memory element M1 becomes an amorphous state. Then, a temperature condition higher than Tx2 is maintained for a period of t2, which is longer than the crystallization time required for crystallizing the memory element M2, and the variable resistive patterns are cooled to a temperature between Tx3 and Tx2. In such case, the memory elements M2 become crystalline states. Subsequently, a temperature condition above Tx3 is maintained for the period of time t3, and they are cooled to a temperature below Tx3. The memory elements M3 become crystalline states. The memory cell which passes through such thermal process results in a data state of (01).

Figure 7D:
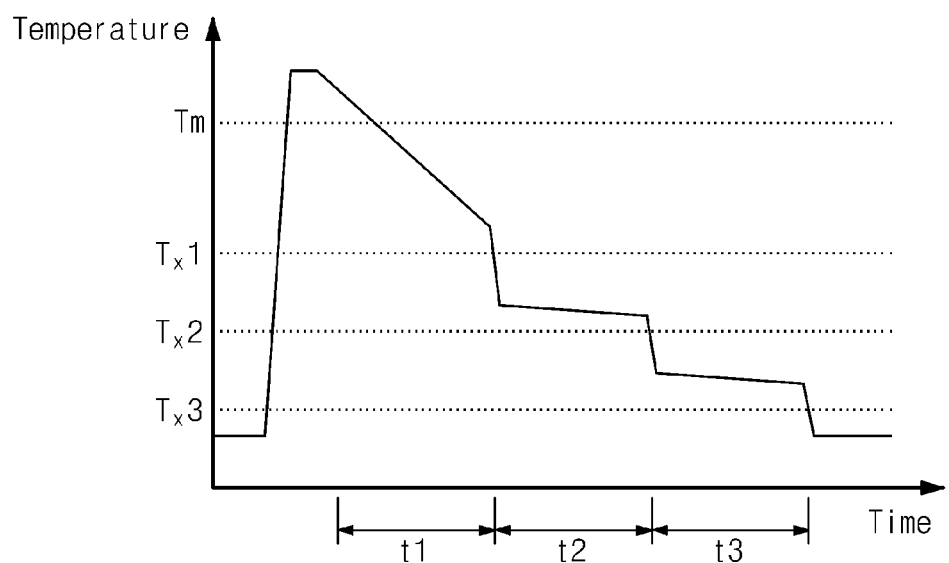

Referring to FIG. 7D, all of the variable resistive patterns are heated to a temperature above the melting point, then slowly cooled to a temperature between Tx2 and Tx1. This step may include cooling of the variable resistive patterns in a temperature condition between Tx1 and the melting point Tm for a period of time t1, which is longer than crystallization time required for crystallizing the memory element M1. In this case, the memory element M1 becomes a crystalline state. Description of the crystallizing of the memory elements M2 and M3 will not be repeated as they are identical to that formerly described with reference to FIG. 7C. The memory cell after such thermal process results in a data state of (00).

The cooling condition (e.g. variation rate of temperature in time) of the above described thermal process may be modified and worked in various other forms. Also, the present invention is not limited to having the variable resistive patterns made of chalcogen compounds, and therefore the method of making difference in the crystallization temperatures is not limited to method using different kinds of material or combination. That is, the idea that the crystallization states of the variable resistive patterns connected in parallel may be selectively changed, by using difference in crystallization temperatures of the variable resistive patterns, is not limited to the above embodiments described with reference to FIGS. 7A to 7D and may be modified to using various other components. Also, according to the present invention, a multi-level memory cell may be switched to desired data state through a single thermal process, without reference to the initial state.

According to an aspect of the present invention, in a writing step in which a resistance level of a memory structure is changed, all of the resistance levels of the memory structure except for the maximum value are changed to a resistance level, the value which the difference from the minimum value is smaller than the difference from the maximum value. Specifically, all of the resistance levels of the memory structure, except for the maximum value, are smaller than a predetermined middle resistance level. Here, the middle resistance level may be a level between ($R_{max}$-$R_{min}$)/30 and $R_{max}$ ($R_{max}$=the maximum value of resistance levels of the memory structure, $R_{min}$=the minimum value of resistance levels of the memory structure).

The memory structure may include a plurality of variable resistive patterns as described above. In this case, the resistance level of the memory structure switched by the writing step is substantially inversely proportional to the number of variable resistive patterns in low resistance level.

According to the present invention, the writing step switches the resistance level of the memory structure to a predetermined single resistance level. The writing operation condition required to switch the resistance level of the variable resistive pattern may be different for each of the variable resistive patterns, and the writing step may include selectively switching the resistance levels of the variable resistive patterns by using each different writing operation condition for each of the variable resistive patterns.

Figure 8A:
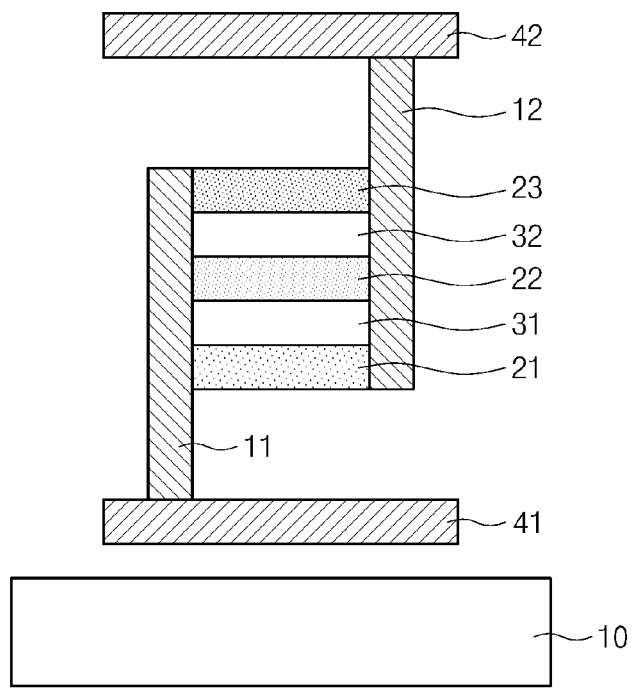
FIGS. 8A and 8B illustrate multi-level memory devices according to exemplary embodiments of the present invention.
Figure 8B:
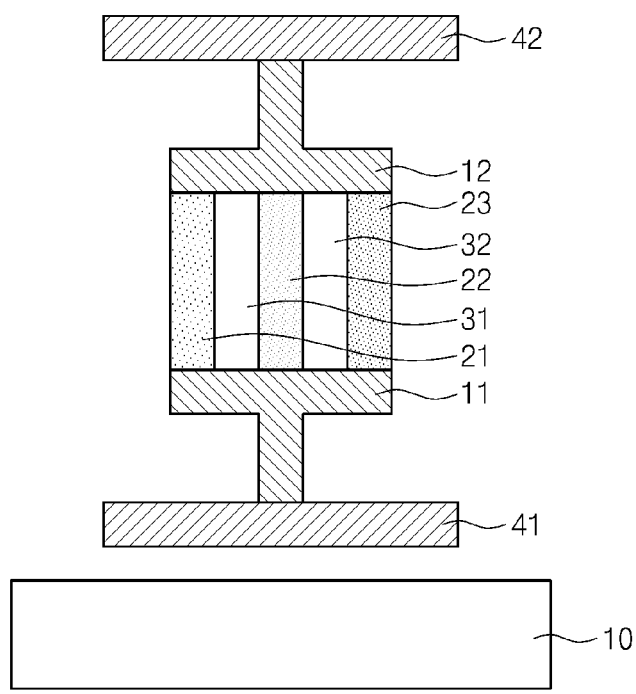

FIG. 8A and FIG. 8B illustrate multi-level memory devices according to embodiments of the present invention. For clarity of description, repeated descriptions in the two embodiments may be omitted.

Referring to FIG. 8A, a lower conductive pattern 41 and a first electrode 11 connected to the lower conductive pattern 41 are disposed on a substrate 10. An upper conductive pattern 42 and a second electrode 12 connected to the upper conductive pattern 42 are disposed on the first electrode 11. According to an embodiment, main planes of the first electrode 11 and the second electrode 12 face each other and they are formed vertical to the upper surface of the substrate 10 (the main planes of the first and the second electrodes 11 and 12 are their largest surfaces). The first and the second electrodes 11 and 12 may be connected to the upper surface of the lower conductive pattern 41 and the lower surface of the upper conductive pattern 42, respectively.

Sequentially stacked variable resistive patterns 21, 22, and 23 are interposed between the first electrode 11 and the second electrode 12, and isolation layer patterns 31 and 32 are interposed between the variable resistive patterns 21, 22, and 23. The variable resistive patterns 21, 22 and 23 may be formed at different levels from the substrate 10, respectively. According to this embodiment, sidewalls of the variable resistive patterns 21, 22, and 23 are configured to contact the main planes of the first and the second electrodes 11 and 12. As a result, the variable resistive patterns 21, 22, and 23 connect the first and the second electrodes 11 and 12 in parallel.

The variable resistive pattern 21, 22 and 23 may be made of a material selected from the above described chalcogen compounds. According to an embodiment, the chalcogen compound may be a compound of tellurium (Te) having a concentration of approximately 20 to 80 atomic percent, antimony (Sb) having a concentration of 5 to 50 atomic percent, and germanium (Ge) having a concentration of the remaining atomic percent. According to the present invention, the variable resistive patterns 21, 22, and 23 may include different kinds of phase-change materials from each other. For example, the variable resistive pattern 21, 22 and 23 may be made of a material having different component ratio of antimony-tellurium-selenium.

Referring to FIG. 8B, in this embodiment, the variable resistive patterns 21, 22 and 23 connect the first and second electrodes 11 and 12 in parallel, from a substantially equal distance from the substrate 10. The main planes of the first and the second electrodes 11 and 12 may be formed to be parallel to the upper surface of the substrate 10. As in the former embodiment, the variable resistive patterns 21, 22 and 23 may be made of different kinds of phase-change materials, or be made of chalcogen compounds having different component ratio of antimony-tellurium-selenium.

FIGS. 9A, 10A, 11A and 12A are plan views illustrating a method of forming a multi-level memory device according to an embodiment of the present invention. FIGS. 9B, 10B, 11B 12B each contain two cross-sectional views taken along lines I-I' and II-II' of FIGS. 9A, 9B, 10B 11B and 12B, respectively, illustrating a method of forming the multi-level memory device according to the embodiment of the present invention.

Figure 9A:
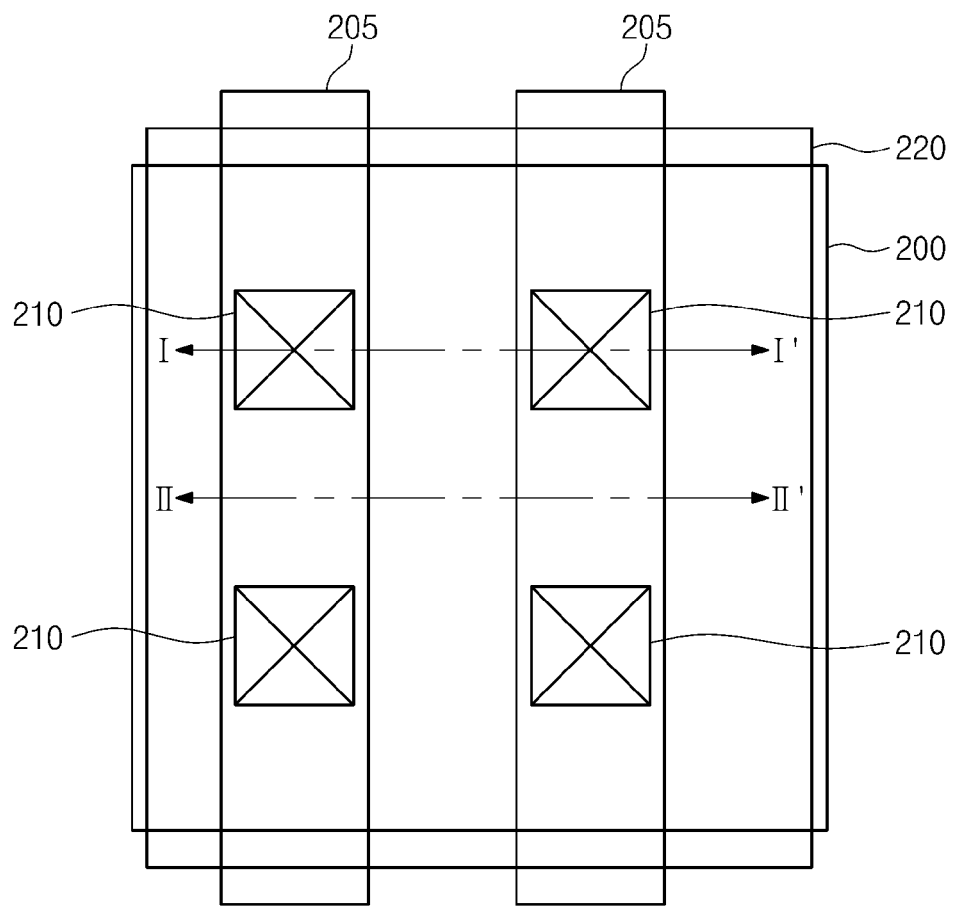
Figure 9B:
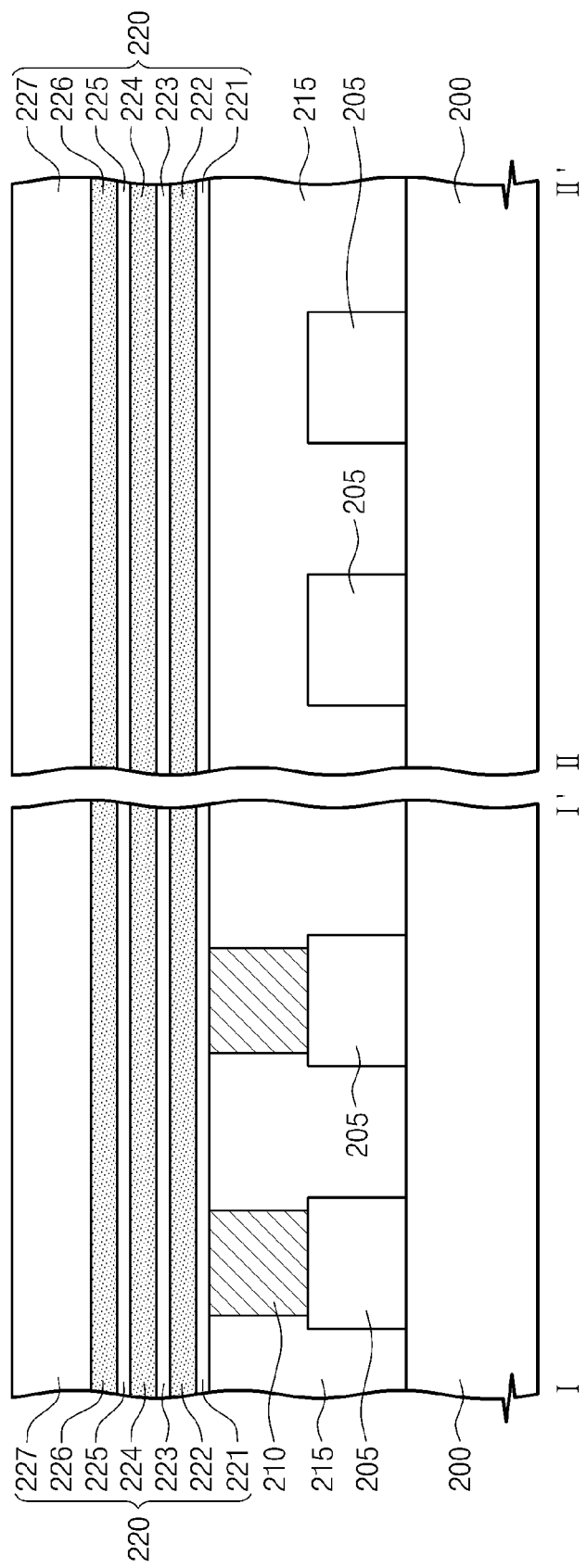

Referring to FIGS. 9A and 9B, lower conductive patterns 210 are formed on a substrate 200, and a memory layer 220, which includes a plurality of variable resistive layers 222, 224, and 226 and isolation layers 223 and 225 therebetween, are formed on the resultant structure.

The variable resistive layers 222, 224, and 226 may be made of materials having different crystallization temperatures. The variable resistive layers 222, 224, and 226 may be made of different kinds of phase-change materials. For example, the variable resistive layers 222, 224, and 226 may be made of one selected from chalcogen compounds including tellurium (Te) having a concentration of approximately 20 to 80 atomic percent, antimony (Sb) having a concentration of 5 to 50 atomic percent, and germanium (Ge) having a concentration of the remaining atomic percent. The antimony-tellurium-selenium component ratio of each variable resistive layer may be different from each other. The variable resistive layers 222, 224, and 226 may be formed using one of chemical vapor deposition or physical vapor deposition method, and thicknesses of the variable resistive layers 222, 224, and 226 may be different from each other.

The isolation layers 223 and 225 may be made of at least one material selected from insulation materials, such as silicon oxide, silicon nitride and silicon oxy-nitride. According to the present invention, the memory layer 220 may further include a capping layer 227 formed on the uppermost variable resistive layer 226, or include a lower isolation layer 221 formed under the lowermost variable resistive layer 222. The capping layer 227 may be made of at least one material selected from a silicon oxide or silicon nitride, and its thickness may be approximately between 100 to 5000 Å. The lower isolation layer 221 separates electrically the lower conductive pattern 210 and the lowermost variable resistive layer 222, and may be formed in a thickness between 50 to 500 Å.

Figure 18A:
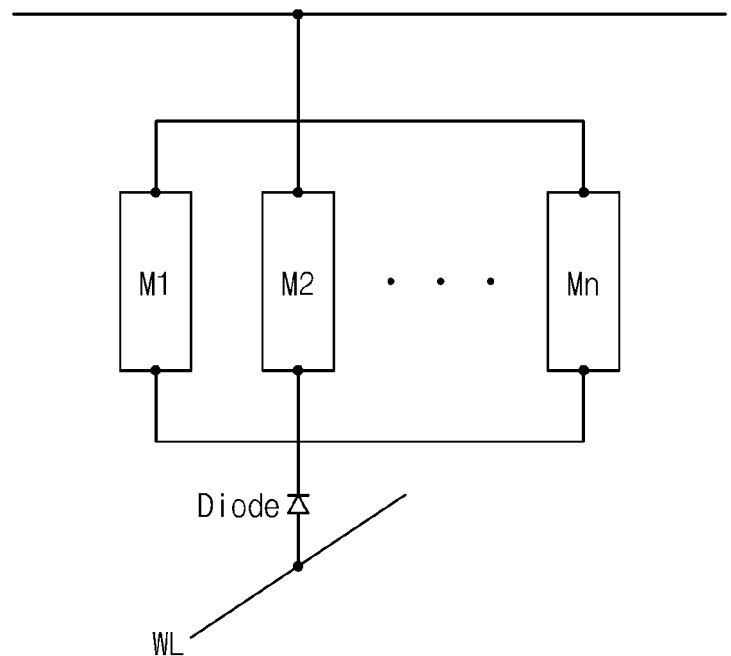
FIG. 18A is a circuit diagram illustrating a multi-level memory device including a diode according the present invention.

The lower conductive patterns 210 may be plugs arranged two-dimensionally on the substrate 200. According to an embodiment, word lines 205 arranged in one direction on the substrate 200 may be further formed, before forming the lower conductive patterns 210. The lower conductive patterns 210 extend through a lower interlayer dielectric 215 to be connected to the word lines 205 therebelow. A diode, as illustrated in FIG. 18A, may be further formed between the lower conductive patterns 210 and the word lines 205.

Figure 18B:
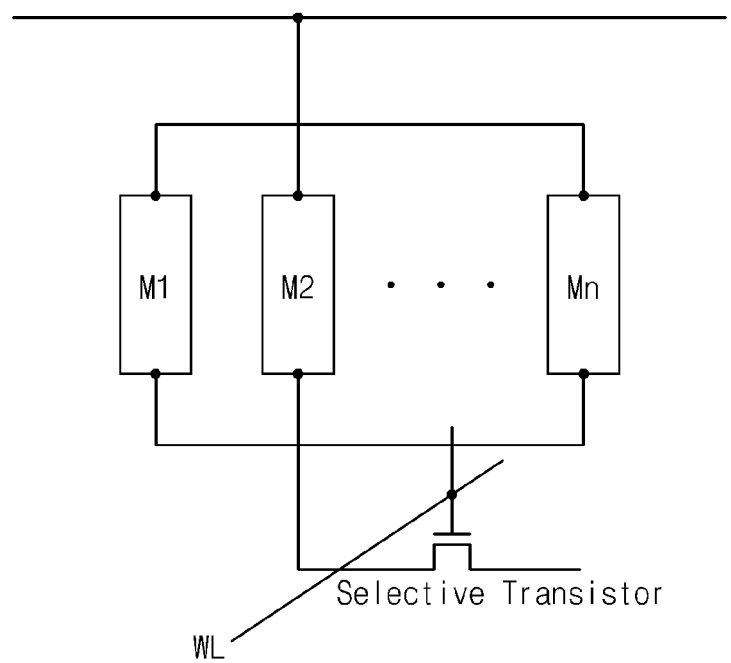
FIG. 18B is a circuit diagram illustrating a multi-level memory device including a selection transistor according the present invention.

According to a modified embodiment of the present invention, the lower conductive pattern 210 may be connected to a drain electrode of a selection transistor, as shown in FIG. 18B, and a gate electrode of the selection transistor may be connected to a word line.

Figure 10A:
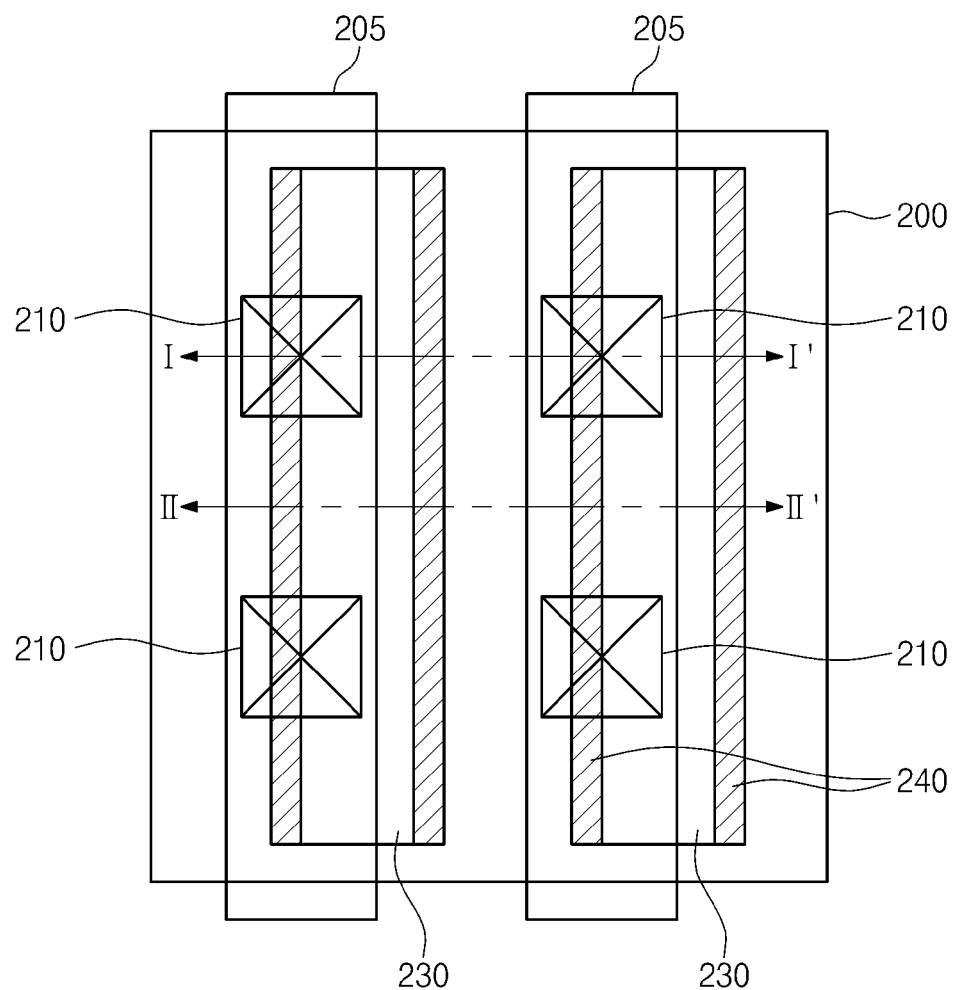
Figure 10B:
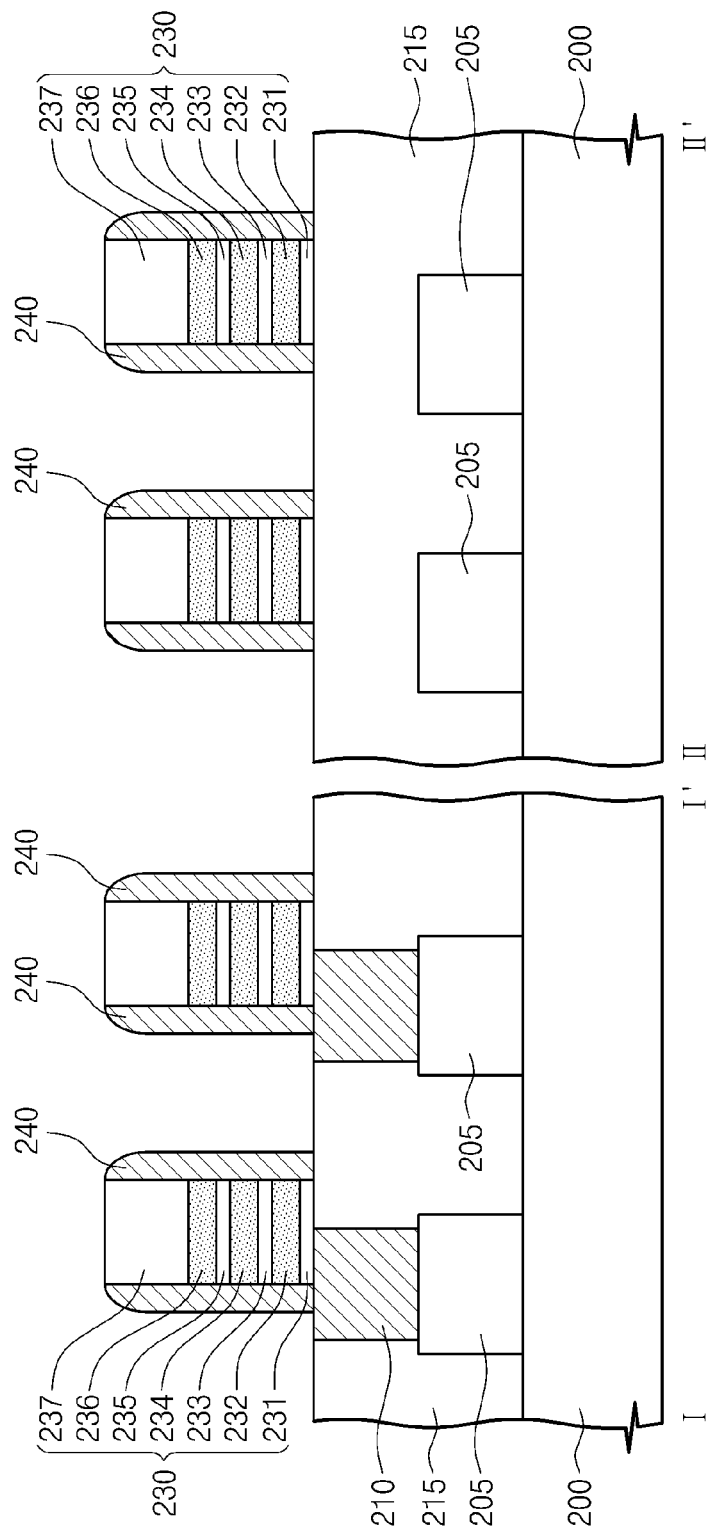

Referring to FIGS. 10A and 10B, the memory layer 220 is patterned to form memory patterns 230, which include sequentially stacked variable resistive patterns 232, 234, and 236 and isolation layer patterns 223 and 235 therebetween.

According to the present invention, the memory patterns 230 may be formed in parallel along one direction. For example, the memory patterns 230 may be formed parallel to the word lines 205, as shown. However, in another embodiment, the memory patterns 230 may be formed so that they cross over the word lines 205. Furthermore, the memory patterns 230 may be formed so that their centers are laterally shifted from the center of the lower conductive pattern 210. According to this embodiment, the memory patterns 230 expose a portion of upper surface of the lower conductive pattern 210, as illustrated.

Conductive spacers 240 (or first and second electrode patterns) are formed on both sidewalls of the memory patterns 230. Forming the conductive spacers 240 includes forming an electrode layer conformally on the resultant structure where the memory patterns 230 are formed, then anisotropically etching the electrode layer to expose an upper surface of the memory pattern 230.

According to the present invention, the conductive spacers 240 may be made of a material selected from nitrides including metal elements, oxy-nitrides including metal elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) and tungsten silicide (WSix). The nitrides including the metal elements may include TiN, TaN, WN, MoN, NbN, TiSiN, TiAlN, TiBN, ZrSiN, WSiN, WBN, ZrAlN, MoSiN, MoAlN, TaSiN and/or TaAlN, and the oxy-nitrides including the metal elements may include TiON, TiAlON, WON, and TaON.

Furthermore, the memory pattern 230 may further include a capping pattern 237 and a lower isolation layer pattern 231, which are formed by patterning the capping layer 227 and lower isolation layer 221. This embodiment is described as having three variable resistive patterns as an example, but the number of the variable resistive patterns and/or number of the isolation layer patterns may be increased or decreased as required.

Figure 11A:
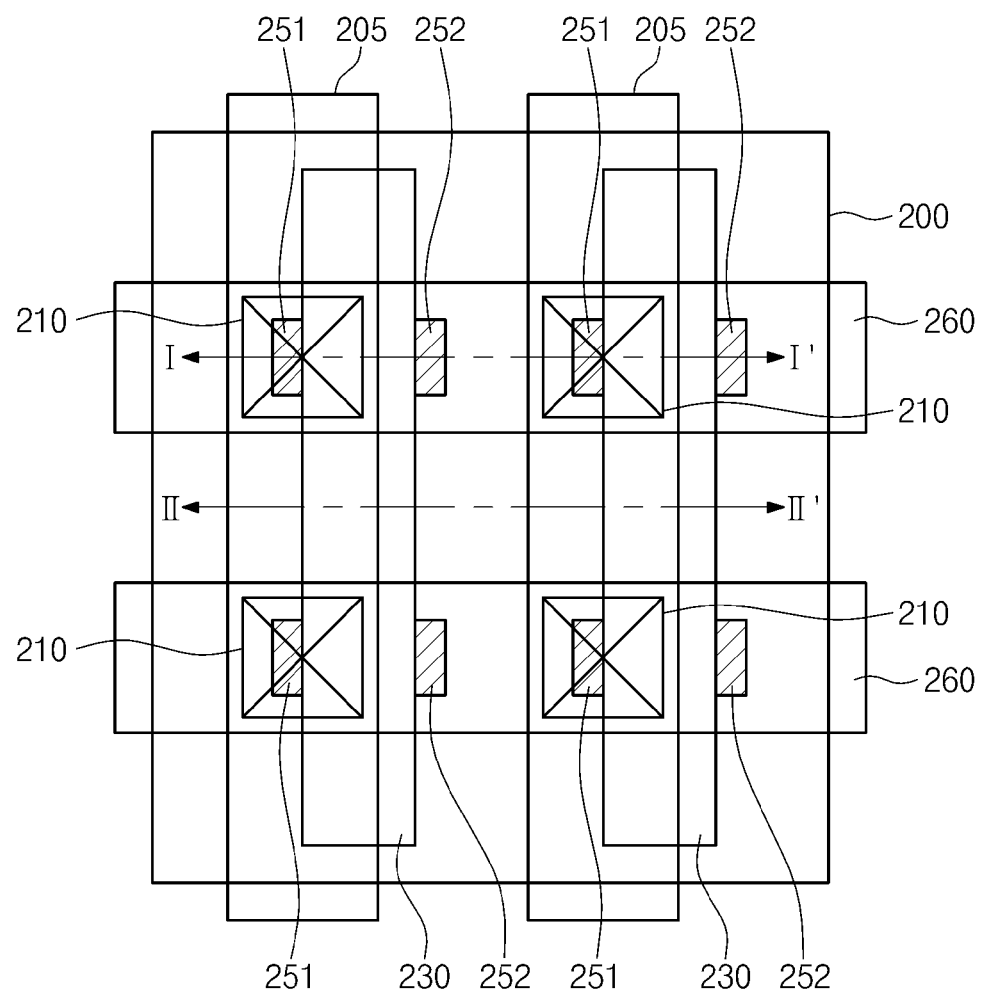
Figure 11B:
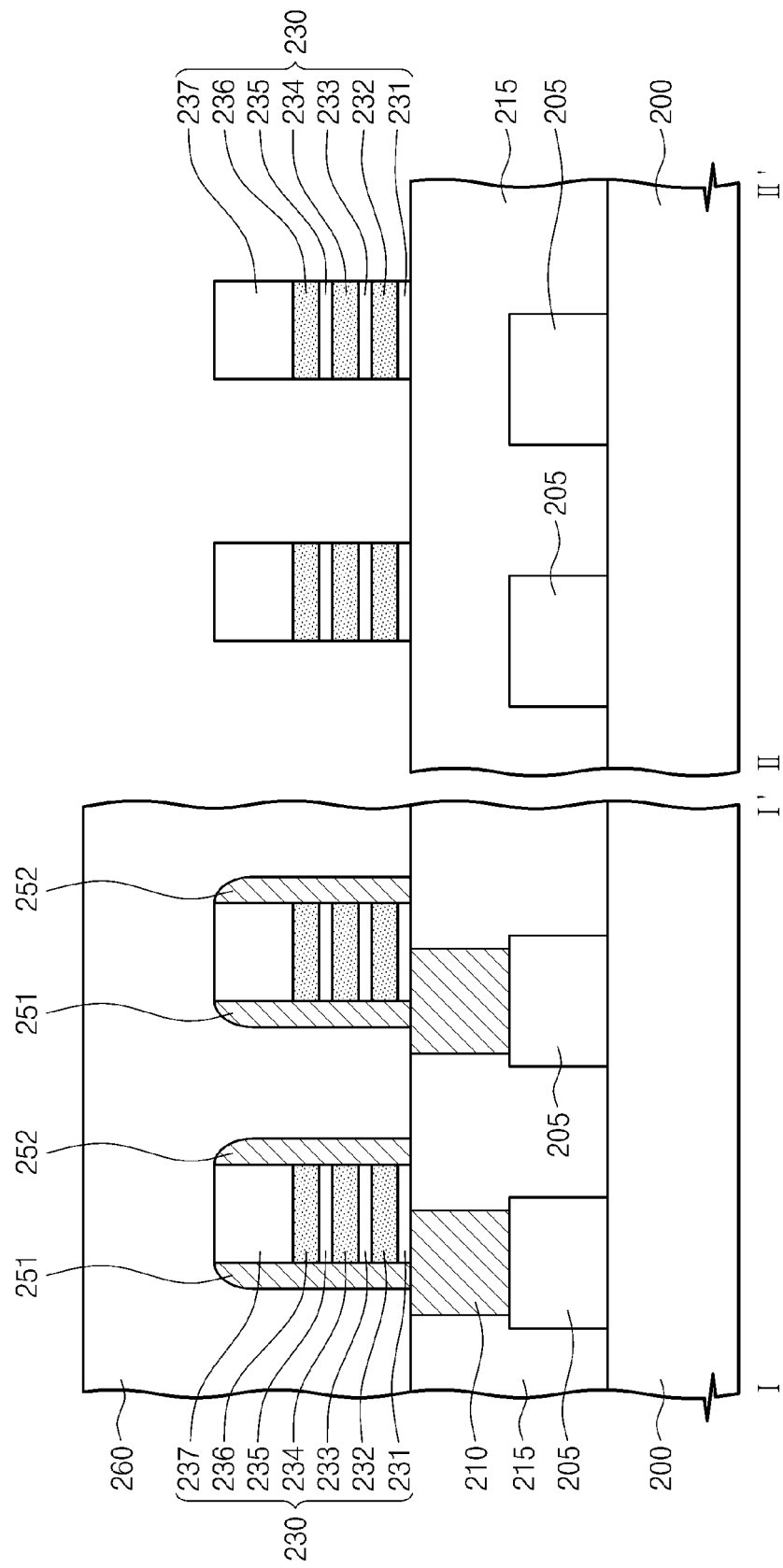

Referring to FIGS. 11A and 11B, the memory patterns 230 and mask patterns 260 which cross over the conductive spacers 240 are formed on the resultant structure where the conductive spacers 240 are formed. First electrodes 251 and second electrodes 252 are formed on both sidewalls of the memory pattern 230, by etching the conductive spacers 240 using the mask pattern 260 as etch mask.

The mask patterns 260 may be photoresist patterns formed by using photolithography. As the width of the conductive spacers 240 is smaller than its height, in case the conductive spacers 240 is etched using anisotropic etch, the components disposed below conductive spacers 240 (e.g. the lower conductive pattern 210) may be damaged by etch. Therefore, it is desirable that etching the conductive spacers 240 be performed by using isotropic etch. In this case, the first and second electrodes 251 and 252 may have smaller widths than the mask pattern 240, as shown.

The first electrodes 251 are disposed on one sidewall of the memory patterns 230, and the second electrodes 252 are formed on the other sidewall of the memory patterns 230. Also, each of the first electrodes 251 and each of the second electrodes 252 are formed on the substrate 200 second-dimensionally, separated from each other as a result of the etch process. According to this embodiment, as the first and second electrodes 251 and 252 are resultant structures of etching the conductive spacers 240, the structural characteristics such as kind of material or width may be identical.

According to a modified embodiment of the present invention, order of the steps anisotropically etching the electrode layer and etching by using the mask pattern 260 may be switched. After the electrode layer is formed to conformally cover the resultant structure where the memory patterns 230 are formed, the mask patterns 260 may be formed so that they cross over the memory patterns 230. By performing anisotropic etch or isotropic etch on the electrode layer by using the mask pattern 260 as etch mask, electrode patterns may be formed to cross over the memory patterns 230. Then after the mask pattern is removed, by performing anisotropic etch on the electrode patterns to expose upper surface of the memory patterns, the first and second electrodes 251 and 252 are formed.

Figure 12A:
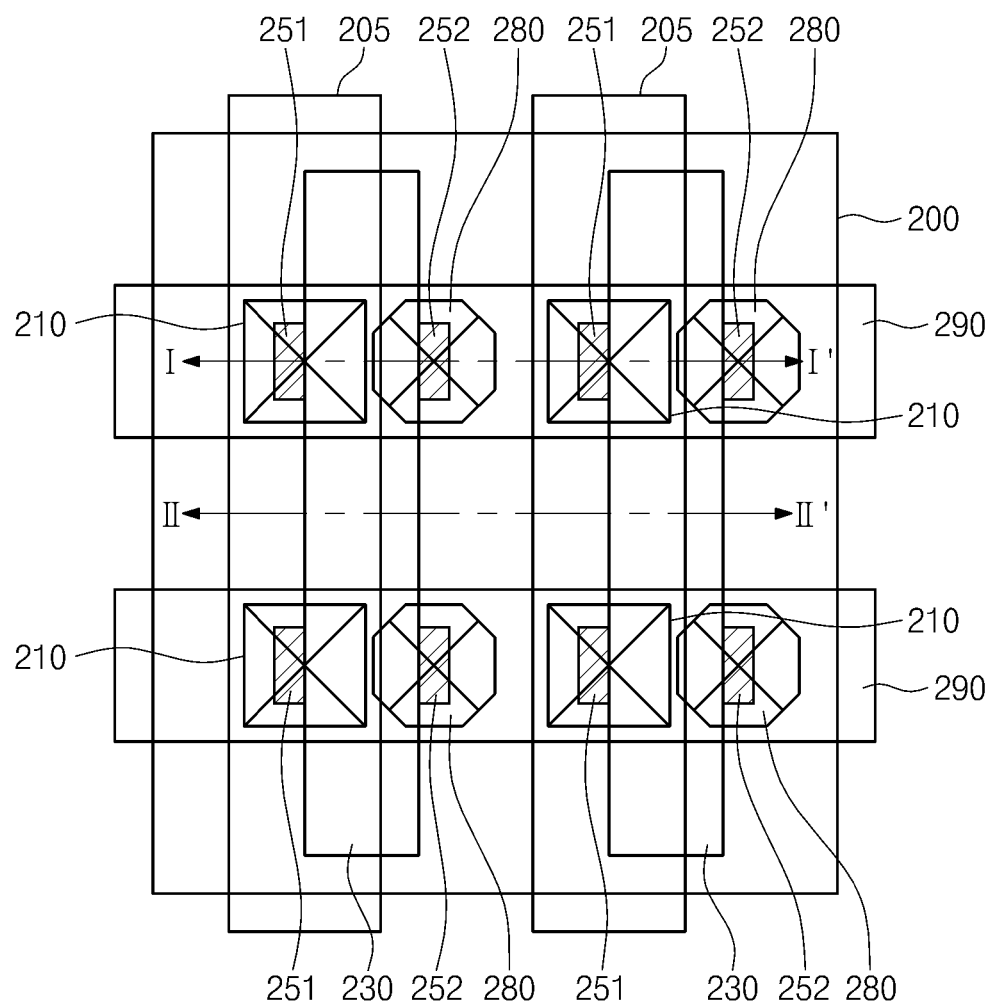
Figure 12B:
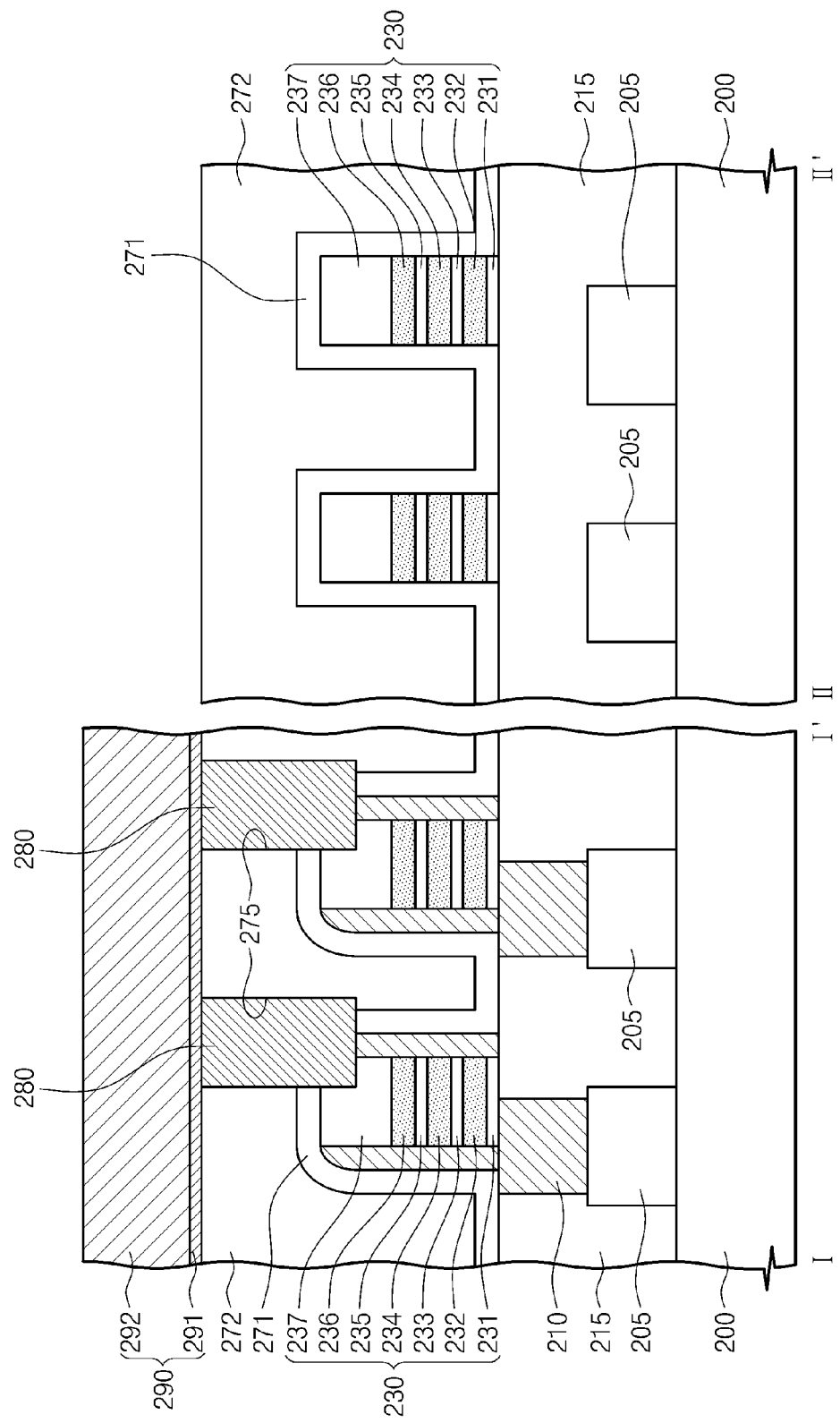

Referring to FIGS. 12A and 12B, after upper interlayer dielectrics 272 is formed on the resultant structure where the first and second electrodes 251 and 252 are formed, the upper interlayer dielectrics 272 is patterned to form contact holes 275 configured to expose the second electrodes 252. Subsequently, contact plugs 280 which fill the contact holes 275 and bit lines 290 which connect the contact plugs 280 are formed.

The step of forming the contact holes 275 include performing anisotropic etch on the upper interlayer dielectrics 272 until the second electrodes 252 are exposed. The capping pattern 237 is made of a material which has etch selectivity to the upper interlayer dielectrics 272, so as to prevent the variable resistive pattern 236 from being exposed by the contact hole 275. Furthermore, in another embodiment of the present invention, before the upper interlayer dielectric layers 272 are formed, etch stop layers 271 may be further formed as illustrated, the etch stop layers 271 configured to conformally cover the resultant structure where the first and second electrodes 251, and 252 are formed. The etch stop layers 271 may be made of material having etch selectivity to the upper interlayer dielectric layers 272, for example, silicon nitride.

FIGS. 13A, 14A, 15A, 16A and 17A are plan views illustrating method of forming a multi-level memory device according to another embodiment of the present invention. FIGS. 13B, 14B, 15B, 16B and 17B are process plan views for illustrating method of forming the multi-level memory device according to another embodiment of the present invention. Specifically, FIGS. 13B, 14B, 15B, 16B and 17B each contain cross-sectional views taken along the lines III-III' and IV-IV' of FIGS. 13A, 14A, 15A, 16A and 17A, respectively.

Figure 13A:
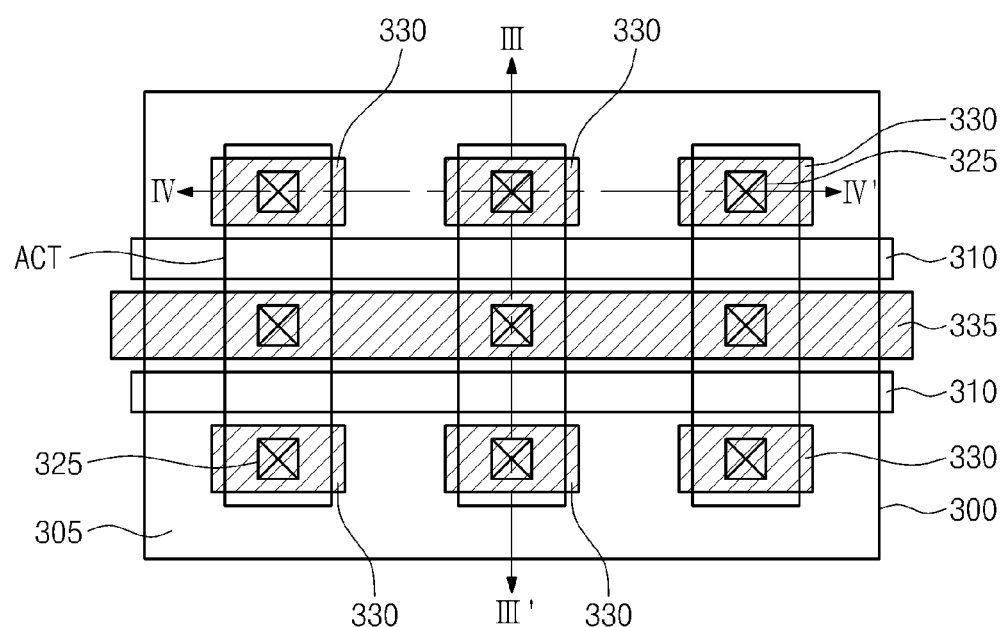
Figure 13B:
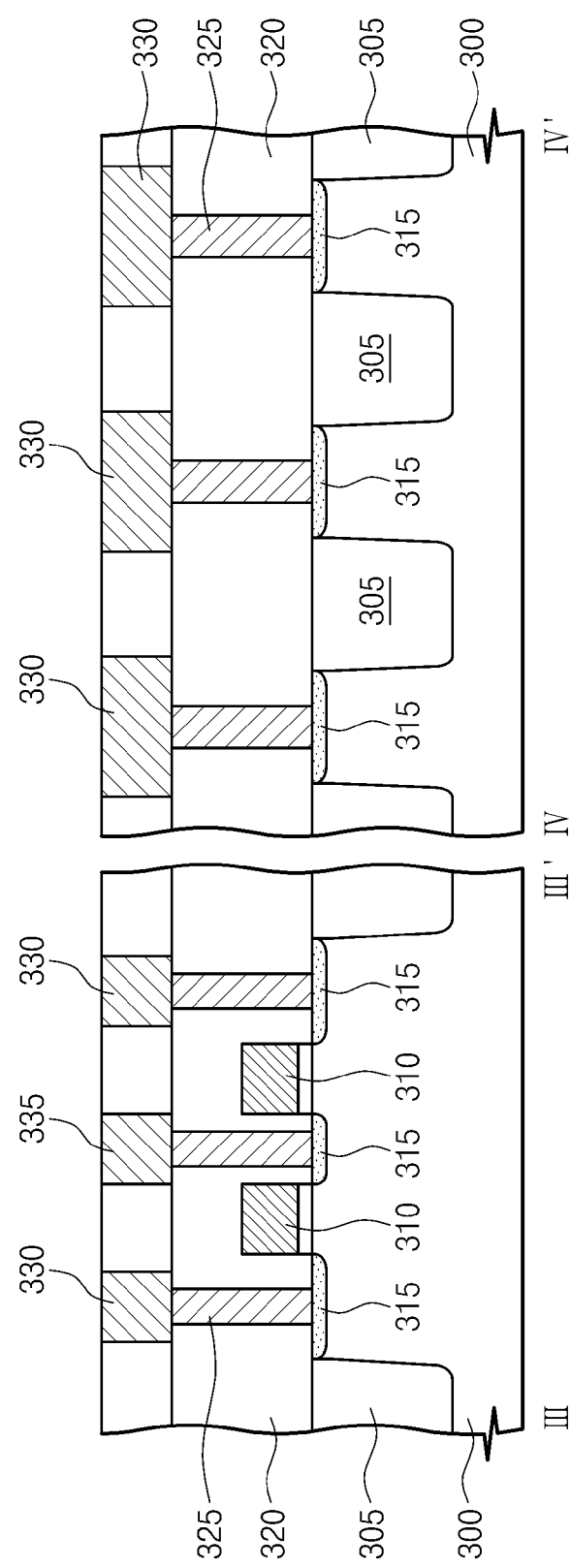

Referring to FIGS. 13A and 13B, after device isolation layer patterns 305 which define active regions ACT are formed on a substrate 300, gate patterns 310 which cross over the active regions ACT are formed. Impurity regions 315, which will be used as source/drain electrodes of transistor, are formed in the active regions ACT on both sides of the gate patterns 310.

According to an embodiment, two gate patterns 310 cross over one of the active regions ACT. Therefore, in one active region ACT, an impurity region 315, which is foamed between the gate patterns 310 and is used as the common source electrode, and two impurity regions 315, which are respectively formed outside of the gate patterns and are used as drain electrodes, are formed.

Subsequently, an interlayer dielectric 320 is formed to cover the gate patterns 310 and contact plugs 325 coupled with the impurity regions 315 are formed to penetrate through the interlayer dielectric 320. Then, contact pads 330 and a source line 335 are formed to be coupled with the contact plugs 325. The contact pads 330 are formed on each of the impurity regions used as drain electrode, and the source line 335 is formed so that it connects the impurity regions used as common source electrode.

Figure 14A:
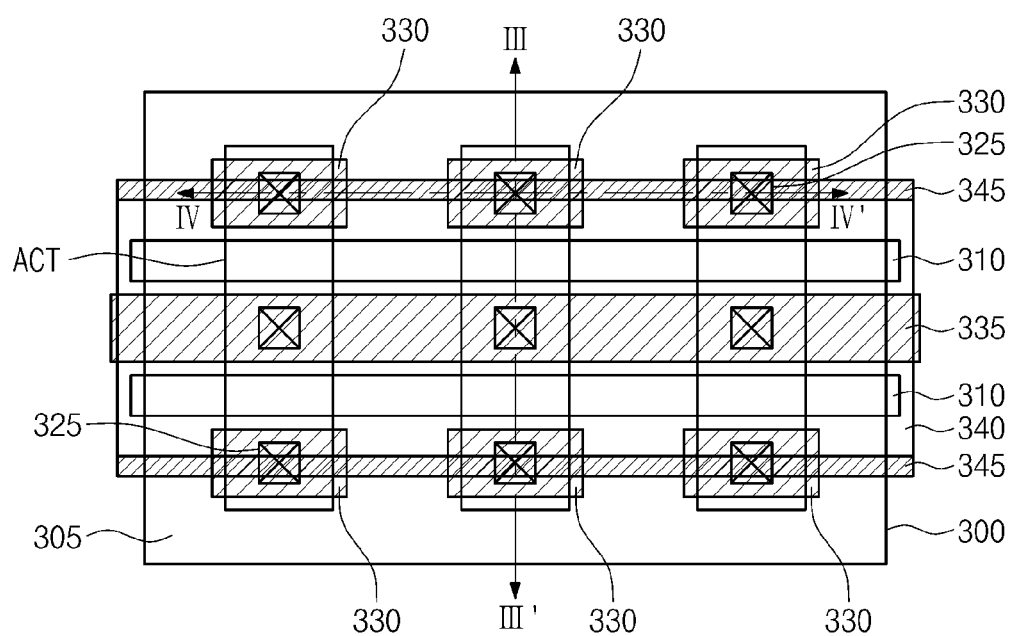
Figure 14B:
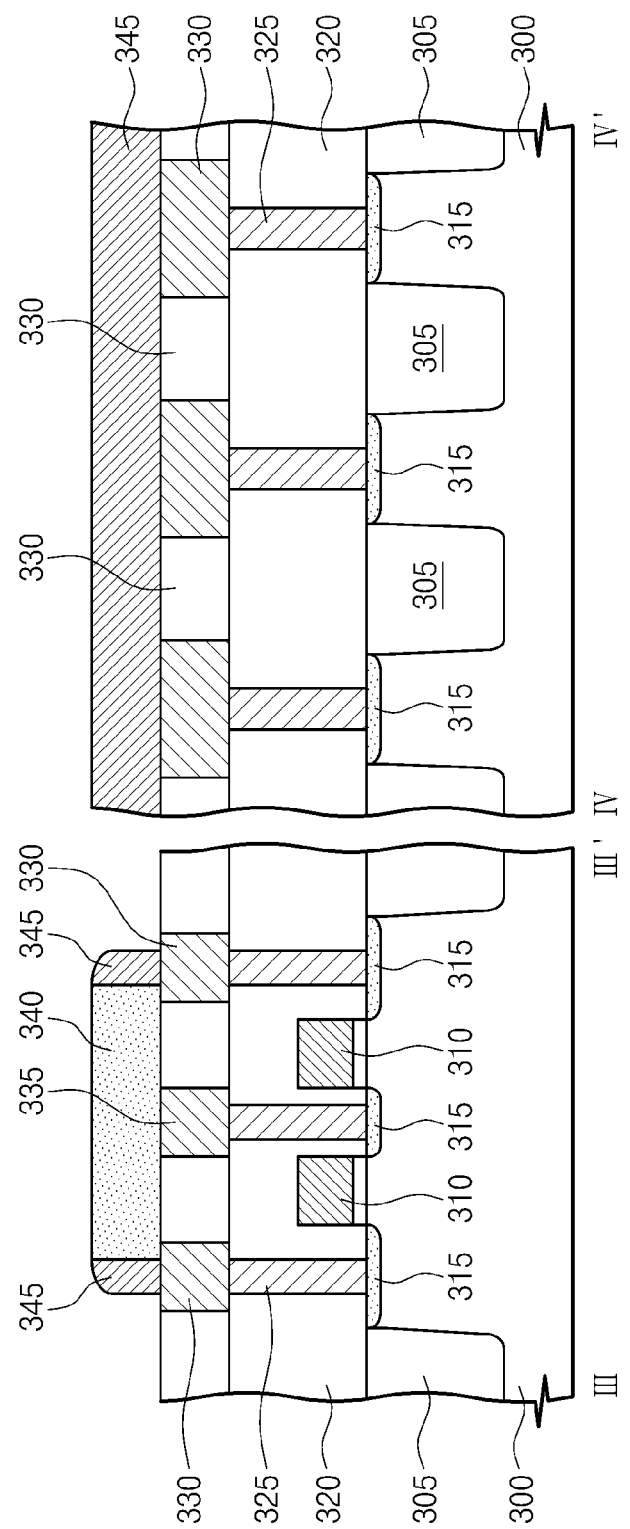

Referring to FIGS. 14A and 14B, after insulation layers filling the contact pads 330 and the source line 335 are formed, a first mold pattern 340 is formed on the resultant structure. The first mold pattern 340 is disposed so that it crosses over the active regions ACT on the source line 335, and exposes portions of the upper surfaces of the contact pads 330. Then spacer conductive patterns 345 are formed on both sides of the first mold pattern 340.

The step of forming the spacer conductive patterns 345 may include, after forming a spacer conductive layer on the resultant structure where the first molding pattern 340, performing anisotropic etch on the spacer conductive layer to expose an upper surface of the first mold pattern 340. The spacer conductive patterns 345 may be made of at least one selected from nitrides including metal elements, oxy-nitrides including metal elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) and tungsten silicide (WSix). The nitrides including the metal elements may include TiN, TaN, WN, MoN, NbN, TiSiN, TiAlN, TiBN, ZrSiN, WSiN, WBN, ZrAlN, MoSiN, MoAlN, TaSiN and/or TaAlN, and the oxy-nitrides including the metal elements may include TiON, TiAlON, WON, and TaON. Alternatively, the first mold pattern 340 may be made of an insulation material, for example, silicon nitride or silicon oxy-nitride.

Figure 15A:
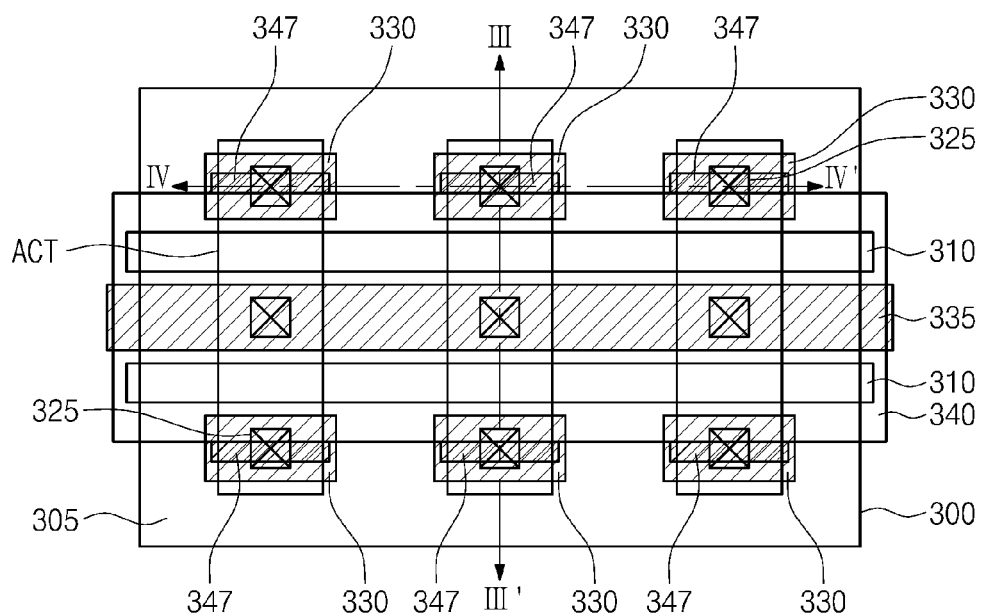
Figure 15B:
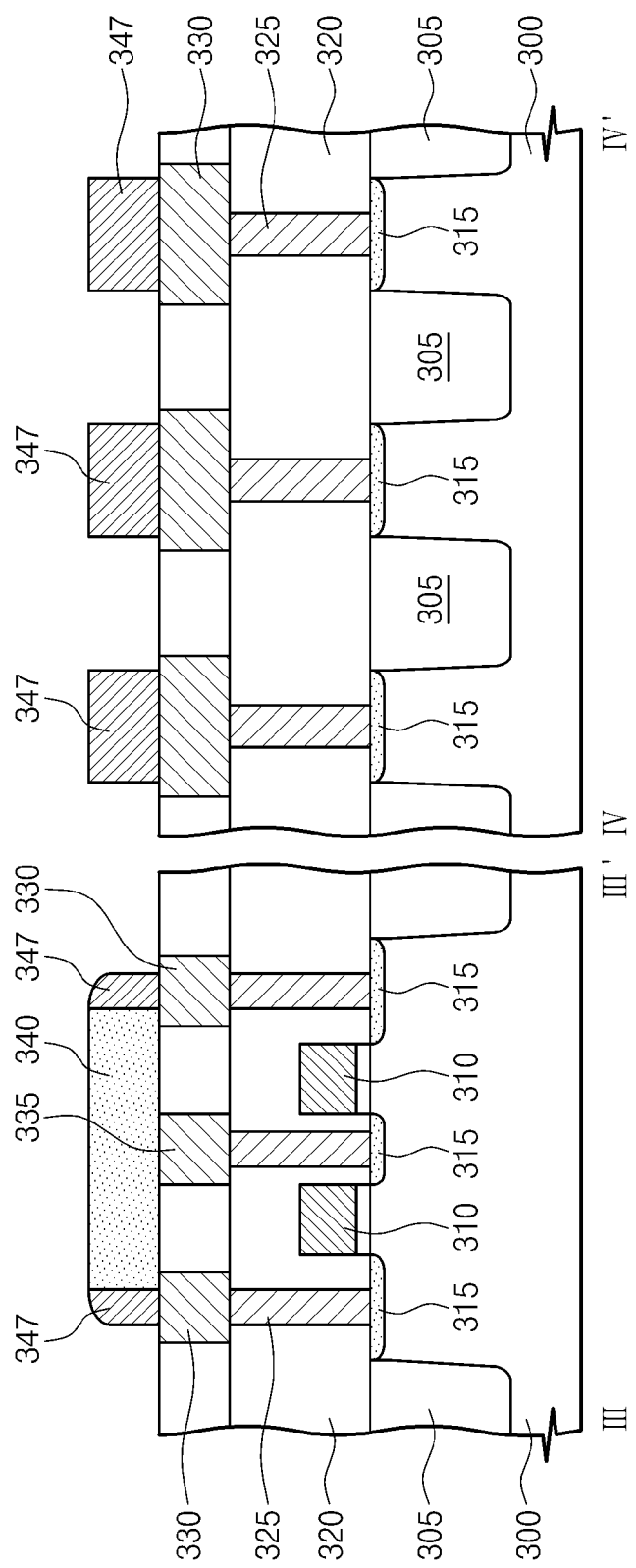

Referring to FIGS. 15A and 15B, the spacer conductive patterns 345 are patterned to form a first electrodes 347 disposed on sidewalls of the first mold pattern 340.

This step may include, after the mask pattern that crosses over the first mold pattern 340 is formed on the contact pads 330, etching the spacer conductive patterns 345 using the mask pattern as etch mask. Accordingly, the first electrodes 347 are formed on each of the contact pads 330. Etching the spacer conductive patterns 345 may be performed using a wet or dry etching process.

Figure 16A:
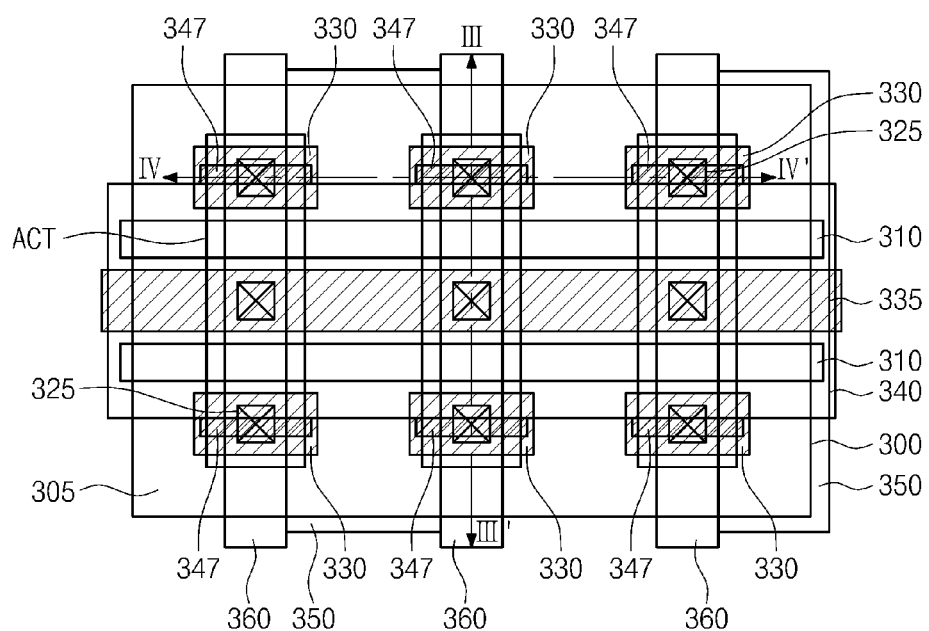
Figure 16B:
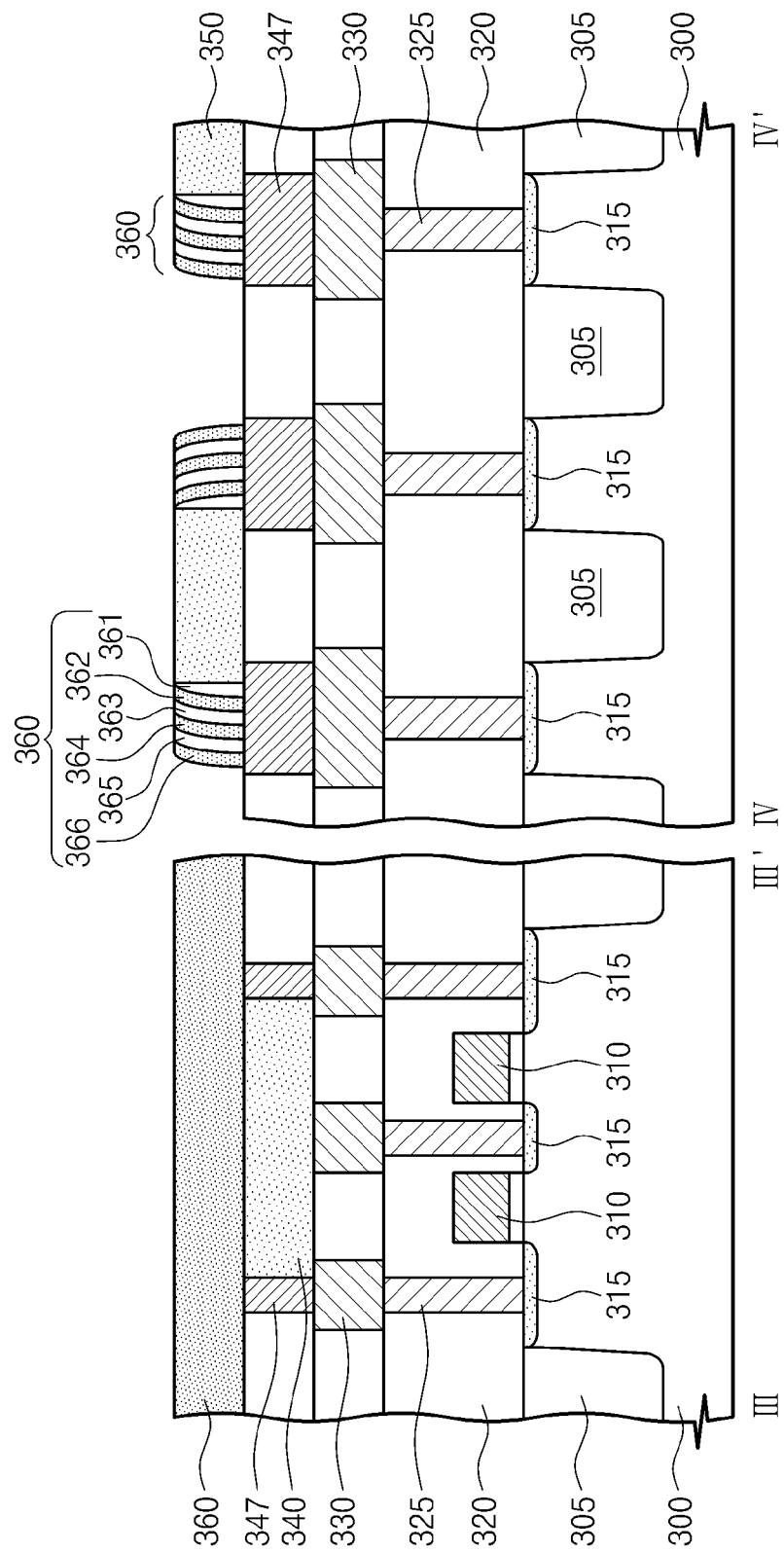

Referring to FIGS. 16A and 16B, a second mold pattern 350 is formed on the first mold pattern 340 and the first electrodes 347. According to this embodiment, the second mold pattern 350 is formed so that it covers the region between the first electrodes 347, in a direction that intersects the first mold pattern 340 and the source line 335. Accordingly, the upper surfaces of the first electrodes 347 are exposed by the second mold pattern 350. Also, the second mold pattern 350 may be made of an insulation material, for example, silicon nitride or silicon oxy-nitride, and the thickness may be between approximately 200 to 500 Å.

Memory patterns 360 are formed on both sidewalls of the second mold pattern 350. The memory patterns 360 include a plurality of variable resistive patterns 362, 364, and 366, and isolation layer patterns 363 and 365 interposed between the variable resistive patterns 362, 364, and 366. Consequently, the memory patterns 360 are connected to the upper surfaces of the first electrodes 347, which are exposed on both sides of the second mold pattern 350.

The variable resistive pattern 362, 364 and 366 and the isolation layer patterns 363 and 365 may be formed by performing repeatedly a conventional spacer forming process, which may include steps of thin layer deposition and anisotropic etching. Three variable resistive patterns are described as an example in this embodiment, however, the number of the variable resistive patterns 362, 364, 366 and the isolation layer patterns 363 and 365 may be varied as required. Meanwhile, mold spacers 361 may be further formed on sidewalls of the second mold pattern 350, before the variable resistive patterns 362, 365, and 366 are formed.

According to this embodiment, the variable resistive patterns 362, 364 and 366 may be made materials having different crystallization temperature, respectively. For example, the variable resistive patterns 362, 364 and 366 may be made of each different phase-change material. More specifically, the variable resistive patterns 362, 364, and 366 may be made of one selected from chalcogen compounds including tellurium (Te) having a concentration of approximately 20 to 80 atomic percent, antimony (Sb) having a concentration of 5 to 50 atomic percent, and germanium (Ge) having a concentration of the remaining atomic percent. The antimony-tellurium-selenium component ratio of each variable resistive layer may be different from each other.

Furthermore, the widths of the variable resistive patterns 362, 364, and 366 may be different from each other. In other words, each of the variable resistive patterns 362, 364, and 366 may have different cross-sectional areas on the plane parallel to the substrate 300.

Figure 17A:
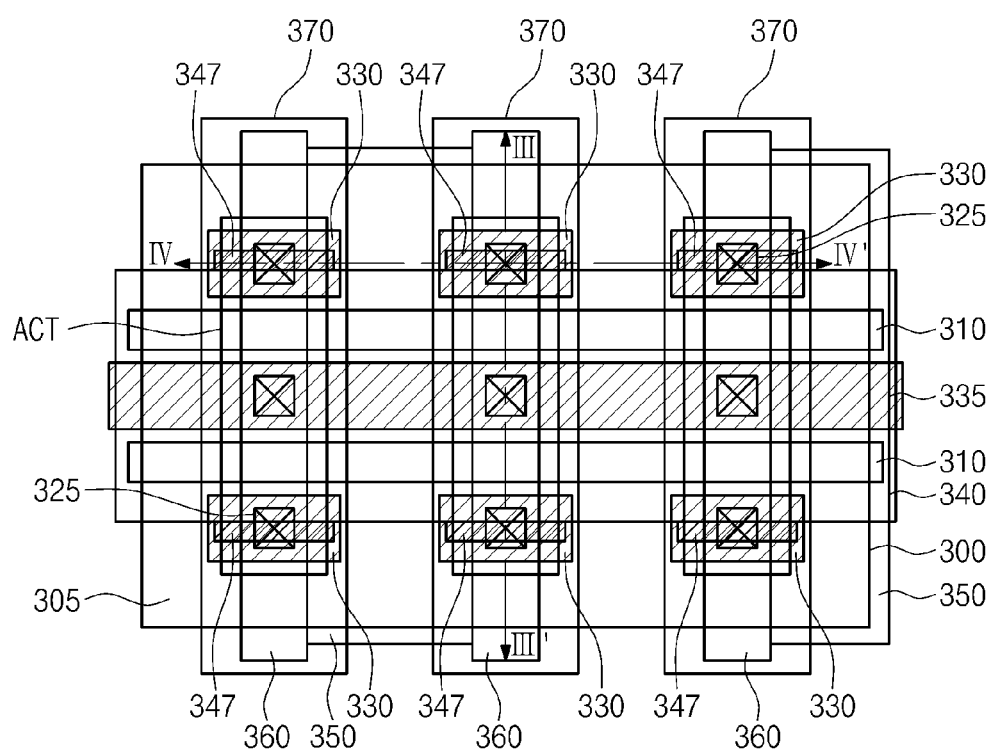
Figure 17B:
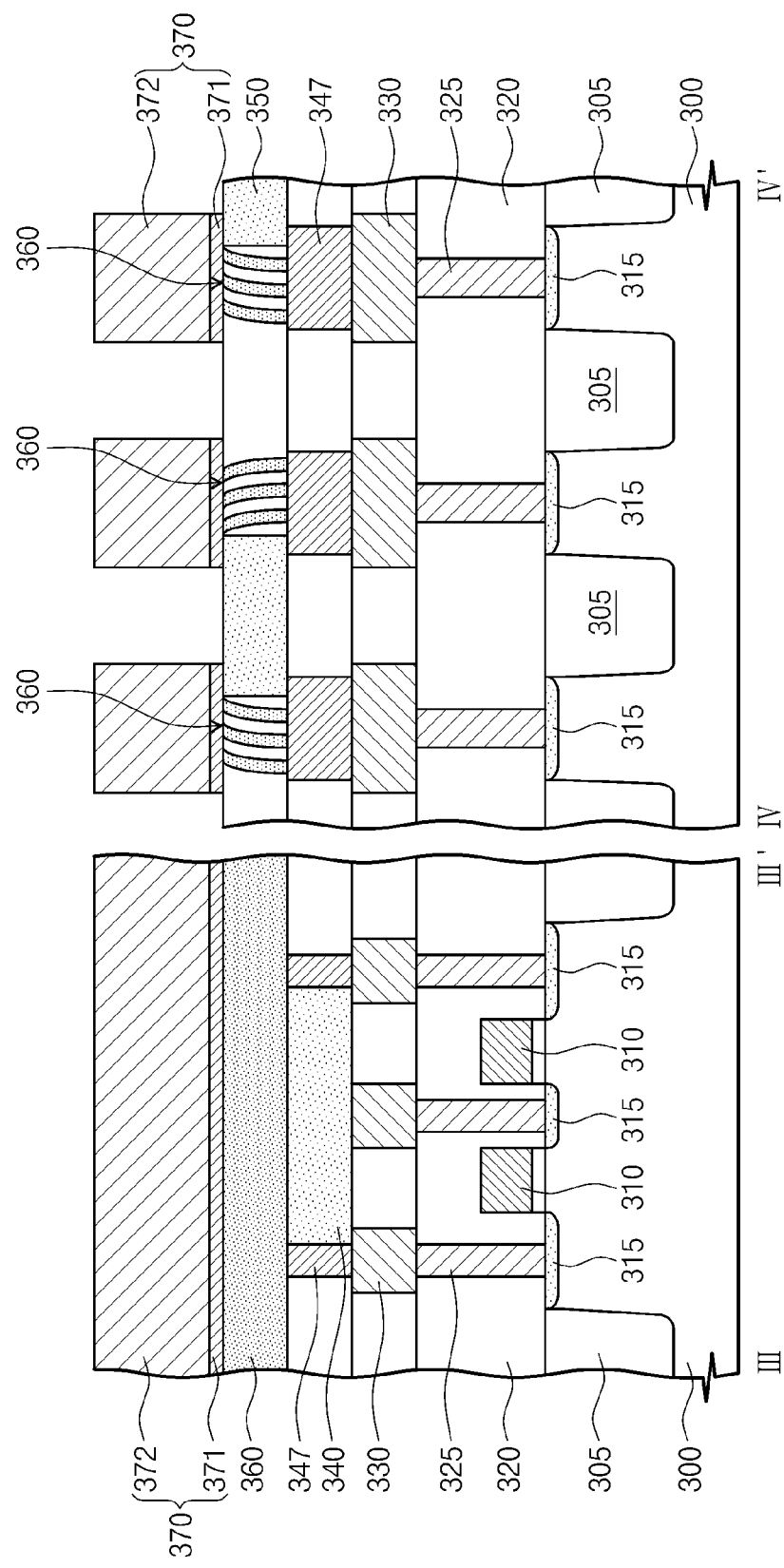

Referring to FIGS. 17A and 17B, second electrodes 370 are formed on the memory patterns 360. The second electrodes 370 may include upper electrode patterns 371 and metal patterns 372, stacked respectively. The second electrodes 270 may be used as bit lines for selecting memory cell. The second electrodes 370 may be formed so that they intersect the gate patterns 310 used as word lines.

The upper electrode patterns 371 may be made of at least one selected from nitrides including metal elements, oxy-nitrides including metal elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW) and tungsten silicide (WSix). The nitrides including the metal elements may include TiN, TaN, WN, MoN, NbN, TiSiN, TiAlN, TiBN, ZrSiN, WSiN, WBN, ZrAlN, MoSiN, MoAlN, TaSiN and/or TaAlN, and the oxy-nitrides including the metal elements may include TiON, TiAlON, WON, and TaON. Alternatively, the first mold pattern 372 may be made of a metallic material, for example, aluminum, copper and tungsten.

According to the above exemplary embodiment, the variable resistive patterns 362, 364 and 366 connect the first and the second electrodes 347 and 370 in parallel, and contrary to the embodiments described with reference to FIGS. 9 to 12, the variable resistive patterns 362, 364 and 366 are formed at substantially equal height from the top surface of the substrate 300.

According to the present invention, variable resistive patterns connecting two electrodes in parallel are provided. Through disposing the variable resistive patterns in parallel, the resistance level of the memory cell including these is determined by a set resistance of the variable resistive patterns, free from resistance drift problem. Accordingly, the resistance drift problem that may occur in time does not occur or is reduced in the multi-level memory device of the present invention. As a result, a multi-level cell having stable electrical characteristic may be realized. Furthermore, according to the present invention, the multi-level memory cell may be shifted into data state through a single thermal process, without reference to the initial state.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-level memory device comprising:
a substrate;
a multi-level memory cell disposed on the substrate, the multi-level memory cell comprising
a first electrode;
a second electrode;
a first phase-change pattern disposed a first distance above a top surface of the substrate; and
a second phase change pattern disposed a second distance above the top surface of the substrate, the second distance being different from the first distance,
wherein the first and second phase-change patterns are connected in parallel between the first electrode and the second electrode.

2. The multi-level memory device of claim 1, wherein the first phase-change pattern and the second phase-change pattern are formed of different compositions of phase-change material.

3. The multi-level memory device of claim 1, wherein the first phase-change pattern and the second phase-change pattern have different crystallization temperatures.

4. The multi-level memory device of claim 3, wherein the first phase-change pattern and the second phase-change pattern have substantially the same crystalline state resistance.

5. The multi-level memory device of claim 4, wherein the first phase-change pattern and the second phase-change pattern have substantially the same amorphous state resistance.

6. The multi-level memory device of claim 1, further comprising a third phase-change pattern connected in parallel with the first and second phase-change patterns between the first electrode and the second electrode.

7. The multi-level memory device of claim 6, wherein each of the first phase-change pattern, the second phase-change pattern and third phase-change pattern are formed of different compositions of phase-change material from each other.

8. The multi-level memory device of claim 6, wherein each of the first phase-change pattern, the second phase-change pattern and third phase-change pattern have different crystallization temperatures from each other.

9. The multi-level memory device of claim 7, wherein the first phase-change pattern, the second phase-change pattern and third phase-change pattern have substantially the same crystalline state resistance.

10. The multi-level memory device of claim 9, wherein the first phase-change pattern, the second phase-change pattern and third phase-change pattern have substantially the same amorphous state resistance.

11. The multi-level memory device of claim 6, further comprising:
a first insulating layer interposed between the first phase-change pattern and the second phase-change pattern; and
a second insulating layer interposed between the second phase-change pattern and the third phase-change pattern,
wherein the first phase-change pattern, the second phase-change pattern, the third phase-change pattern, the first insulating layer and the second insulating layer are stacked on the substrate.

12. The multi-level memory device of claim 6, wherein the phase-change materials of the multi-level memory cell consists of the first phase-change material, the second phase-change material and the third phase-change material.

13. The multi-level memory device of claim 6,
wherein the multi-level memory cell comprises a stack of the first, second and third phase change materials and insulating layers separating the first, second and third phase change materials from each other, and
wherein the first electrode is formed on a first sidewall of the stack and the second electrode is formed on a second sidewall of the stack.

14. The multi-level memory device of claim 13, wherein the first sidewall of the stack is formed of first sidewalls of the first, second and third phase change materials and the first electrode contacts the first sidewalls of the first, second and third phase change materials.

15. The multi-level memory device of claim 6, wherein a resistance of the multi-level memory cell is substantially inversely proportionate to a number of the phase change patterns in a low resistance level state.

16. The multi-level memory device of claim 6, wherein each of the first, second and third phase change materials has a high resistance value and a low resistance value such that a total resistance of the multi-level memory cell is changeable between plural discrete resistances.

17. The multi-level memory device of claim 16, wherein all discrete resistances except for a maximum value of the plural discrete resistances of the multi-level memory cell are below an average of $R_{max}$ and $R_{min}$, where $R_{max}$ is a maximum value of the plural discrete resistances of the multi-level memory cell and $R_{min}$ is a minimum value of the plural discrete resistances of the multi-level memory cell.

18. The multi-level memory device of claim 16, wherein all discrete resistances except for the maximum value of the plural discrete resistances of the multi-level memory cell are below $(R_{max}-R_{min})/30$ where $R_{max}$ is a maximum value of the plural discrete resistances of the multi-level memory cell and $R_{min}$ is a minimum value of the plural discrete resistances of the multi-level memory cell.

* * * * *